(12) United States Patent
Kiyama et al.

(10) Patent No.: US 9,647,058 B2
(45) Date of Patent: May 9, 2017

(54) DIODE

(71) Applicant: Sumitomo Electric Industries, Ltd., Osaka (JP)

(72) Inventors: Makoto Kiyama, Itami (JP); Takashi Matsuura, Itami (JP); Mitsuru Shimazu, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 88 days.

(21) Appl. No.: 14/614,097

(22) Filed: Feb. 4, 2015

(65) Prior Publication Data

US 2015/0221780 A1 Aug. 6, 2015

(30) Foreign Application Priority Data

Feb. 6, 2014 (JP) ................................. 2014-020945

(51) Int. Cl.
| | | |
|---|---|---|
| *H01L 29/06* | (2006.01) | |
| *H01L 29/36* | (2006.01) | |
| *H01L 29/40* | (2006.01) | |
| *H01L 29/66* | (2006.01) | |
| *H01L 29/872* | (2006.01) | |

(Continued)

(52) U.S. Cl.
CPC .......... *H01L 29/0619* (2013.01); *H01L 29/36* (2013.01); *H01L 29/402* (2013.01); *H01L 29/6606* (2013.01); *H01L 29/872* (2013.01); *H01L 29/1608* (2013.01); *H01L 29/2003* (2013.01)

(58) Field of Classification Search
CPC .... H01L 29/0619; H01L 29/40–29/407; H01L 29/872; H01L 29/6606; H01L 29/1608; H01L 29/1602; H01L 29/2003
See application file for complete search history.

(56) References Cited

U.S. PATENT DOCUMENTS

| | | | |
|---|---|---|---|
| 2007/0215899 A1* | 9/2007 | Herman | H01L 27/0605 257/147 |
| 2008/0093637 A1* | 4/2008 | Sankin | H01L 29/872 257/263 |
| 2008/0160685 A1* | 7/2008 | Sankin | H01L 29/0619 438/180 |

OTHER PUBLICATIONS

Lidow, "GaN—the New Frontier for Power Conversion," Jun. 2010, Bodo's Power Systems, 32-33.*

(Continued)

*Primary Examiner* — Joshua King
(74) *Attorney, Agent, or Firm* — Venable LLP; Michael A Sartori; F. Brock Riggs

(57) ABSTRACT

A diode having excellent switching characteristics is provided. A diode includes a silicon carbide substrate, a stop layer, a drift layer, a guard ring, a Schottky electrode, an ohmic electrode, and a surface protecting film. At a measurement temperature of 25° C., a product R•Q of a forward ON resistance R of the diode and response charges Q of the diode satisfies relation of $R \cdot Q \leq 0.24 \times V_{blocking}^2$. The ON resistance R is found from forward current-voltage characteristics of the diode. A reverse blocking voltage $V_{blocking}$ is defined as a reverse voltage which produces breakdown of the diode. The response charges Q are found by integrating a capacitance (C) obtained in reverse capacitance-voltage characteristics of the diode in a range from 0 V to $V_{blocking}$.

8 Claims, 20 Drawing Sheets

(51) Int. Cl.
  *H01L 29/16*  (2006.01)
  *H01L 29/20*  (2006.01)

(56) References Cited

OTHER PUBLICATIONS

Perez et al., "Planar Edge Termination Design and Technology Considerations for 1.7-kV 4H-SiC PiN Diodes," Oct. 2005, IEEE Transactions on Electron Devices, vol. 52, No. 10, 2309-2316.*
Kiyama et al., U.S. Appl. No. 14/614,064, "Diode," filed Feb. 4, 2015.
Kiyama et al., U.S. Appl. No. 14/614,078, "Diode," filed Feb. 4, 2015.
Kiyama et al., U.S. Appl. No. 14/614,087, "Diode," filed Feb. 4, 2015.
Hatakeyama et al., "Over 3.0 GW/cm$^2$ Figure-of-Merit GaN p-n Junction Diodes on Free-Standing GaN Substrates," IEEE Electron Device Letters, vol. 32, No. 12, pp. 1674-1676, Dec. 2011.

* cited by examiner

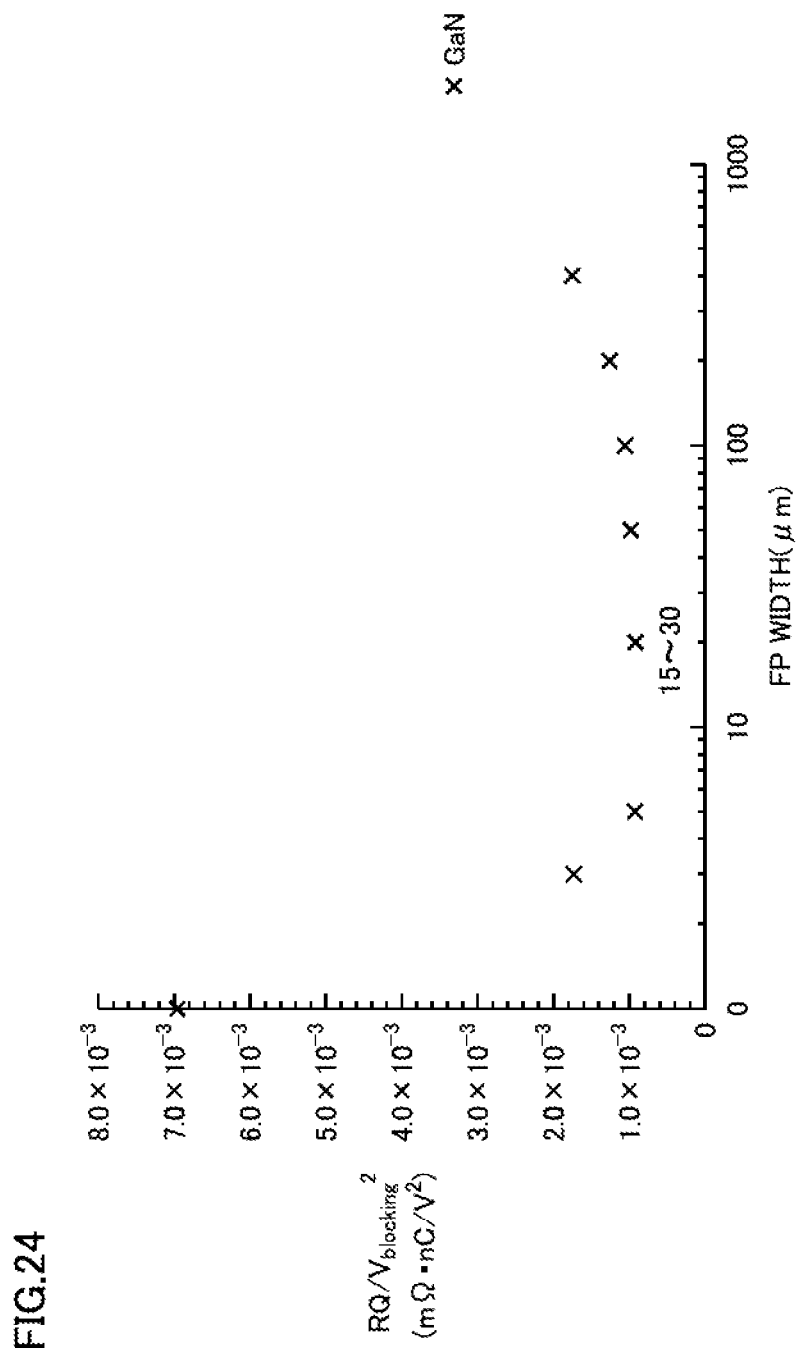

DIODE

BACKGROUND OF THE INVENTION

Field of the Invention

The present invention relates to a diode, and in particular to a diode required to be high in breakdown voltage and low in ON resistance.

Description of the Background Art

Silicon (Si) has conventionally been adopted as a semiconductor material for fabricating a power semiconductor element. Such performance as a low loss, a high breakdown voltage, and a high operation speed, however, has been approaching to the theoretical limit of a silicon semiconductor element.

A semiconductor greater in band gap than silicon, is called a "wide band gap semiconductor." Owing to a wide band gap semiconductor, drastic improvement in performance of a power semiconductor element is expected. For example, a wide band gap semiconductor such as silicon carbide (SiC) or gallium nitride (GaN) has attracted attention as a material for a power semiconductor. For example, ON resistance characteristics of a p-n junction diode formed on a freestanding GaN substrate have been reported in Yoshitomo Hatakeyama, Kazuki Nomoto, Naoki Kaneda, Toshihiro Kawano, Tomoyoshi Mishima, Tohru Nakamura, "Over 3.0 GW/cm$^2$ Figure-of-Merit GaN p-n Junction Diodes on FreeStanding GaN Substrates," IEEE ELECTRON DEVICE LETTERS, Vol. 32, No. 12, pp. 1674-1676, December 2011.

SUMMARY OF THE INVENTION

In particular, in connection with a power diode, ON resistance characteristics have mainly been evaluated. An ON resistance can be used for evaluation of a conduction loss in a diode during operation of the diode. It is difficult, however, to evaluate a switching loss in a diode based on an ON resistance. By evaluating switching characteristics of a diode with an appropriate approach, a diode having better switching characteristics can be realized.

An object of the present invention is to provide a diode having excellent switching characteristics.

A diode according to one aspect of the present invention includes an active layer and first and second electrodes for applying a forward voltage and a reverse voltage to the active layer. Change in voltage with respect to a current in forward current-voltage characteristics of the diode at the time when the forward voltage is applied to the active layer through the first and second electrodes is defined as a forward ON resistance R. A reverse voltage ⅔ times as high, as the reverse voltage at the time when breakdown, of the diode is produced through, the first and second electrodes is defined as a reverse blocking voltage $V_{blocking}$ (unit: V). Charges obtained by integrating a reverse capacitance in a range of the reverse voltage from 0 to $V_{blocking}$ in accordance with reverse capacitance-voltage characteristics of the diode at the time when the reverse voltage is applied to the diode through the first and second electrodes are defined as response charges Q of the diode. At a measurement temperature of 25° C., a product R•Q of forward ON resistance R and response charges Q satisfies relation of R•Q≤0.24× $V_{blocking}^2$. Here, a unit for R is mΩ and a unit for Q is nC.

According to the present invention, a diode having excellent switching characteristics can be provided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 24 is a diagram showing FP width dependency of factor of proportionality A shown in FIG. 23.

DESCRIPTION OF THE PREFERRED EMBODIMENTS

Figure 1:
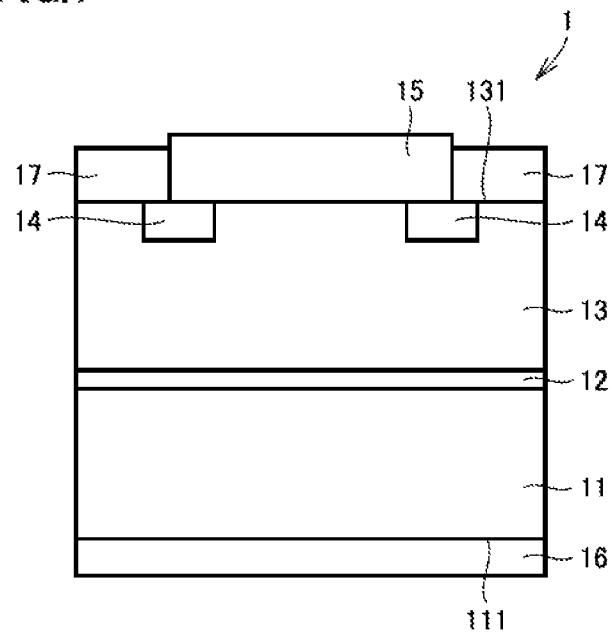
FIG. 1 is a cross-sectional view schematically showing a structure of a diode according to a first embodiment.

Description of Embodiments of the Invention of the Subject Application

Embodiments of the present invention will initially be listed and described.

(1) A diode according to one embodiment of the present invention includes an active layer and first and second electrodes for applying a forward voltage and a reverse voltage to the active layer. Change in voltage with respect to a current in forward current-voltage characteristics of the diode at the time when the forward voltage is applied to the active layer through the first and second electrodes is defined as a forward ON resistance R. A reverse voltage ⅔ times as high as the reverse voltage at the time when breakdown of the diode is produced through the first and second electrodes is defined as a reverse blocking voltage $V_{blocking}$ (unit: V). Charges obtained by integrating a reverse capacitance in a range of the reverse voltage from 0 to $V_{blocking}$ in accordance with reverse capacitance-voltage characteristics of the diode at the time when the reverse voltage is applied to the diode through the first and second electrodes are defined as response charges Q of the diode. At a measurement temperature of 25° C., a product R•Q of forward ON resistance R and response charges Q satisfies relation of $R•Q \leq 0.24 \times V_{blocking}^2$. Here, a unit for R is mΩ and a unit for Q is nC.

According to the configuration above, a diode having excellent switching characteristics can be provided. The RQ product is a good indicator representing a total loss in the diode. Furthermore, the RQ product is in proportion to a square of reverse blocking voltage $V_{blocking}$ ($R•Q \propto V_{blocking}^2$). By setting this factor of proportionality to 0.24 or smaller, a diode achieving reduction in loss can be realized. Therefore, a diode having excellent switching characteristics can be realized.

(2) Preferably, the product R×Q satisfies relation of $R•Q \leq 0.1 \times V_{blocking}^2$.

According to the configuration above, when, silicon (Si) is employed as a material for the diode, a diode having excellent switching characteristics can be provided.

(3) Preferably, a semiconductor material forming the diode is silicon.

According to the configuration above, when silicon (Si) is employed as a material for the diode, a diode having excellent switching characteristics can be provided.

(4) Preferably, the product R•Q satisfies relation of $R•Q \leq 4.7 \times 10^{-3} \times V_{blocking}^2$.

According to the configuration above, when a wide band gap semiconductor is employed as a material for the diode, a diode having excellent switching characteristics can be provided.

(5) More preferably, a semiconductor material forming the diode is silicon carbide.

According to the configuration above, when silicon carbide (SiC) is employed as a material for the diode, a diode having excellent switching characteristics can be provided.

(6) Preferably, the product R•Q satisfies relation of $R•Q \leq 1.2 \times 10^{-3} \times V_{blocking}^2$.

According to me configuration above, when a wide band gap semiconductor is employed as a material for the diode, a diode having excellent switching characteristics can be provided.

(7) More preferably, a semiconductor material forming the diode is gallium nitride.

According to the configuration above, when gallium nitride (GaN) is employed as a material for the diode, a diode having excellent switching characteristics can be provided.

(8) Preferably, the diode includes an edge-termination structure formed in the active layer. The edge-termination, structure has a width not smaller than 5 μm and not larger than 200 μm.

According to the configuration above, a high blocking voltage of the diode can be ensured while significant increase in loss in the diode is prevented.

Details of Embodiments of the Invention of the Subject Application

An embodiment of the present invention will be described hereinafter with reference to the drawings. In the drawings below, the same or corresponding elements have the same reference characters allotted and description thereof will not be repeated. In crystallographic denotation herein, an individual, orientation, a group orientation, an individual plane, and a group plane are shown in [ ], < >, ( ), and { }, respectively. Moreover, a crystallographically negative index is normally expressed by a number with a bar "–" thereabove, however, a negative sign herein precedes a number.

A diode according to the embodiment of the present invention can be applied to any of a pn junction, diode and a Schottky diode. Some examples of diodes according to the embodiment of the present invention will be described below. The embodiment of the present invention, however, is not limited to the diode described below.

First Embodiment

Element Structure

A diode 1 according to a first embodiment is a Schottky barrier diode (SBD) composed of silicon carbide (SiC). FIG. 1 is a cross-sectional view schematically showing a structure of the diode according to the first embodiment.

Referring to FIG. 1, diode 1 includes a silicon carbide substrate 11, a stop layer 12, a drift layer 13 (an active layer), a guard ring 14, a Schottky electrode 15, an ohmic electrode 16, and a surface protecting film 17.

Stop layer 12 and drift layer 13 are composed of silicon carbide. Stop layer 12 is arranged on silicon carbide substrate 11. Drift layer 13 is arranged on stop layer 12. Guard ring 14 is arranged in drift layer 13 so as to be in contact with a surface of drift layer 13. Each of silicon carbide substrate 11, stop layer 12, and drift layer 13 has an n conductivity type. Guard ring 14 is reverse in conductivity type to each drift layer 13. For example, guard ring 14 has a p conductivity type.

Schottky electrode 15 is in contact with a surface 131 of drift layer 13. A material for Schottky electrode 15 is appropriately selected in order to realize a Schottky junction between Schottky electrode 15 and drift layer 13. Schottky electrode 15 overlaps with guard ring 14. Schottky electrode 15 corresponds to an anode electrode of diode 1.

Ohmic electrode 16 is in contact with a surface 111 of silicon carbide substrate 11. Surface 111 of silicon carbide substrate 11 is a surface located opposite to a surface where stop layer 12 is arranged. A material for ohmic electrode 16 is appropriately selected in order to realize an ohmic junction between ohmic electrode 16 and silicon carbide substrate 11. Ohmic electrode 16 corresponds to a cathode electrode of diode 1.

Surface protecting film 17 covers a part of surface 131 of drift layer 13 other than a portion in contact with Schottky electrode 15. Surface protecting film 17 is composed, for example, of polyimide.

Manufacturing Process

Example 1-1

600-V Class SiC-SBD

One example of conditions for forming diode 1 shown in FIG. 1 is described. The conditions described below are conditions, for example, for forming a 600-V class SiC-SBD.

Initially, silicon carbide substrate 11 composed of a hexagonal silicon carbide single crystal having a poly type 4H was prepared. Resistivity of silicon carbide substrate 11 was 20 (mΩ·cm). A thickness of silicon carbide substrate 11 was 400 μm. A surface of silicon carbide substrate 11 for growing an epitaxial layer had an 8°-off Si-terminated surface (a (0001) plane) inclined toward the a axis.

N-type stop layer 12 and n-type drift layer 13 were formed through epitaxial growth on the surface of silicon carbide substrate 11. A concentration of a donor in stop layer 12 was $2 \times 10^{18}$ cm$^{-3}$. A thickness of stop layer 12 was 0.5 μm. A concentration of a donor in drift layer 13 was $6 \times 10^{15}$ cm$^{-3}$. A thickness of drift layer 13 was 5 μm. A substrate constituted of silicon carbide substrate 11, stop layer 12, and drift layer 13 is hereinafter also called a "silicon carbide epitaxial substrate."

P-type guard ring 14 was formed in drift layer 13 with an ion implantation method. Boron (B) ions were selectively implanted into drift layer 13 with the use of an implantation mask composed of aluminum (Al). Boron ions were implanted into drift layer 13 such that a total width of guard ring 14 was 50 μm, a depth of guard ring 14 was 0.5 μm, and a peak concentration in guard ring 14 was approximately $5 \times 10^{17}$ cm$^{-3}$.

After implantation of the boron ions, activation annealing of the silicon carbide epitaxial substrate was carried out. Specifically, in an argon (Ar) gas atmosphere, the silicon carbide epitaxial substrate was heated to 1600° C. for 30 minutes. Thereafter, in an oxygen atmosphere, the silicon carbide epitaxial substrate was subjected to heat treatment at 1150° C. for 80 minutes, to thereby form a sacrificial oxidation film to approximately 40 nm on the surface of drift layer 13. The sacrificial oxidation film was etched with hydrofluoric acid, to thereby remove a damaged layer located at a surface portion of drift layer 13.

Then, a nickel (Ni) electrode having a thickness of approximately 0.2 μm was formed on surface 111 (a back surface) of silicon carbide substrate 11 with sputtering. Thereafter, in the Ar gas atmosphere, the silicon carbide epitaxial substrate was subjected to heat treatment at 970° C. for 3 minutes, to thereby form ohmic electrode 16.

Then, with sputtering, a titanium (Ti) electrode having a thickness of 0.1 μm was formed on the entire surface of drift layer 13, and in succession, an Al electrode having a thickness of 5 μm was formed. Thereafter, the Al electrode was selectively etched with photolithography and etching with a phosphoric-acid-based etchant (H$_3$PO$_4$:CH$_3$COOH: HNO$_3$), and the Ti electrode was selectively etched with photolithography and etching with a buffered hydrofluoric acid (BHF) etchant. Thus, as shown in FIG. 1, Schottky electrode 15 was formed such that end portions of Schottky electrode 15 lie over across guard ring 14. A width of a portion of guard ring 14 overlapping with Schottky electrode 15 (hereinafter referred to as a "GR width") was 15 μm in terms of a design value.

As shown in Table 1, five types of samples different in area of a junction interface were prepared. The "junction interface" refers to a region where Schottky electrode 15 and drift layer 13 are in direct contact with each other. This region is located on an inner side of guard ring 14. A region of drift layer 13 in contact with Schottky electrode 15 (an opening) had a square shape. In order to prevent concentration of electric field at a corner portion, a corner portion of Schottky electrode 15 and a corner portion of guard ring 14 were rounded (a radius of curvature being set to 20 μm).

TABLE 1

| | Sample 1 | Sample 2 | Sample 3 | Sample 4 | Sample 5 |
|---|---|---|---|---|---|
| Junction Interface Area (mm$^2$) | 0.78 | 1.0 | 1.6 | 2.3 | 3.1 |

Then, polyimide was used to form surface protecting film 17. Thereafter, with EB evaporation, a backside pad electrode (not shown) constituted of a Ti film (having a thickness of 50 nm), a Pt film (having a thickness of 100 nm), and an Au film (having a thickness of 2 μm) was formed on ohmic electrode 16.

The silicon carbide epitaxial substrate was diced into chips. The chip was mounted on a package through die-bonding and wire-bonding. Die-bonding was carried out with the use of Sn—Ag solder at 230° C. Wire-bonding was carried out with the use of an Al wire.

Example 1-2

1200-V Class SiC-SBD

A 1200-V class SiC-SBD was fabricated with some conditions in the manufacturing process in Example 1-1 (the 600-V class SiC-SBD) being modified. Specifically, a concentration of a donor in stop layer 12 was set to $2 \times 10^{18}$ cm$^{-3}$ and a thickness of stop layer 12 was set to 1 μm. A concentration of a donor in drift layer 13 was set to $4 \times 10^{15}$ cm$^{-3}$ and a thickness of drift layer 13 was set to 10 μm. Furthermore, a GR width was set to 30 μm.

As shown in Table 2, five types of samples different in injunction interface area were prepared by changing a size of Schottky electrode 15.

TABLE 2

| | Sample 1 | Sample 2 | Sample 3 | Sample 4 | Sample 5 |
|---|---|---|---|---|---|
| Junction Interface Area (mm$^2$) | 0.69 | 1.7 | 2.8 | 3.5 | 5.2 |

Since other conditions are the same as the conditions in the manufacturing process in Example 1-1, subsequent description will not be repeated.

<Evaluation Method>

An ON resistance R, a reverse blocking voltage V$_{blocking}$, and charges Q of diode 1 were measured (evaluated) with a method below. A measurement temperature in each measurement was set to 25° C.

(1) ON Resistance

Figure 2:
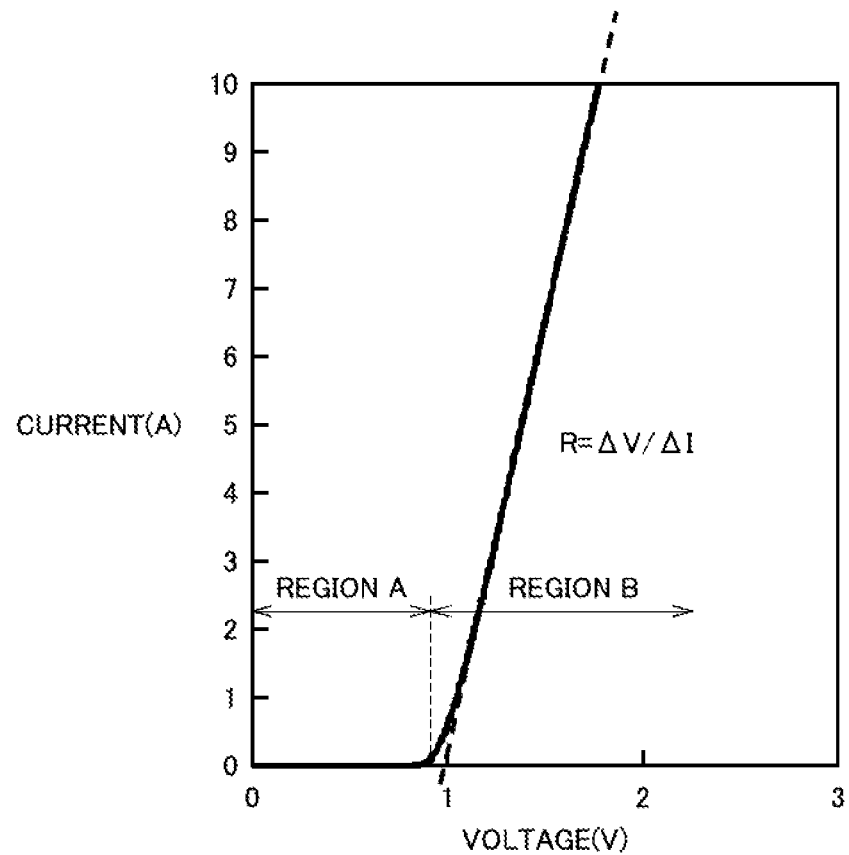
FIG. 2 is a diagram showing one example of forward current-voltage characteristics of a diode.

FIG. 2 is a diagram showing one example of forward current-voltage characteristics of the diode. Referring to FIG. 2, a region showing the forward current-voltage characteristics of the diode is divided into a region A and a region B. Region A is a region where substantially no current flows through the diode even when a forward voltage is applied to the diode. Region B is a region where a current linearly increases with a forward voltage. ON resistance R (=ΔV/ΔI) was derived from an inclination of a straight line in region B.

Figure 3:
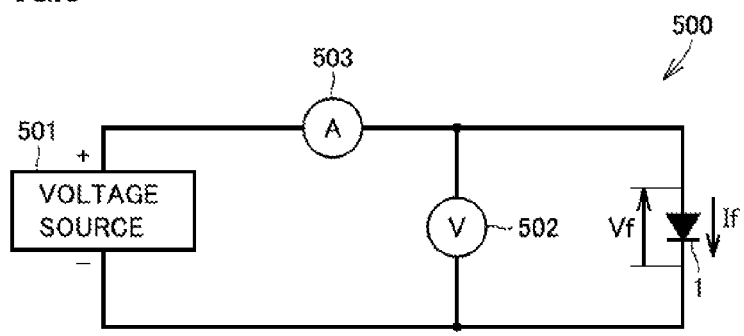
FIG. 3 is a diagram showing one example of a configuration tor measuring the forward current-voltage characteristics of the diode.

FIG. 3 is a diagram showing one example of a configuration, for measuring the forward current-voltage characteristics of the diode. Referring to FIG. 3, a measurement circuit 500 includes a voltage source 501, a voltmeter 502, and an ammeter 503. Voltage source 501 applies a forward voltage Vf across the anode electrode and the cathode electrode of diode 1. Voltage source 501 can vary forward voltage Vf. Voltmeter 502 measures forward voltage Vf. Ammeter 503 measures a forward current If.

(2) Reverse Blocking Voltage

Figure 4:
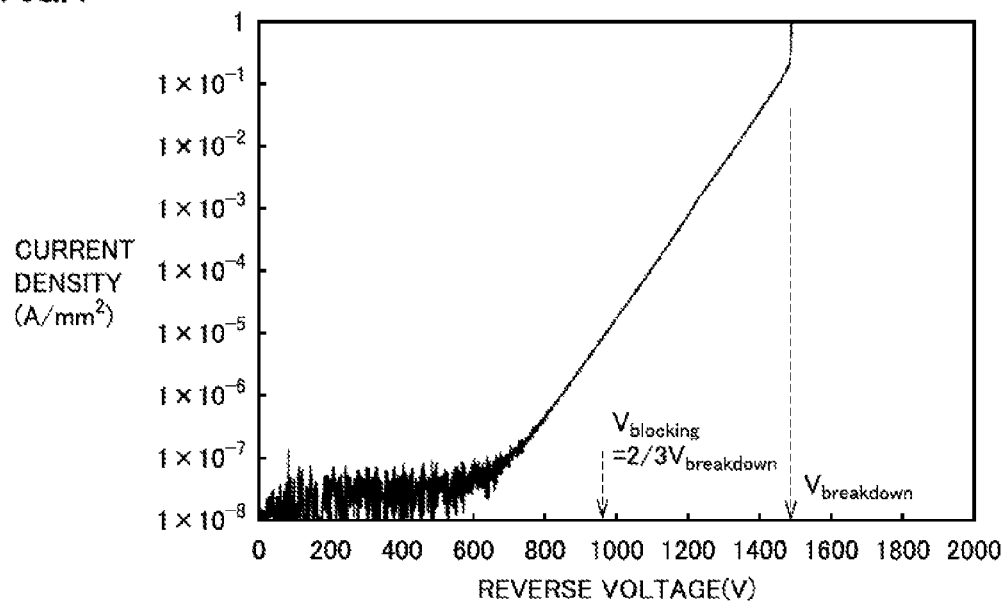
FIG. 4 is a diagram showing one example of reverse current-voltage characteristics of a diode.

FIG. 4 is a diagram showing one example of reverse current-voltage characteristics of a diode. Referring to FIG. 4, with increase in reverse voltage applied to the diode, a reverse current increases. A reverse current significantly increases at a certain voltage $V_{breakdown}$. A phenomenon of significant increase in reverse current is called breakdown. More specifically, electrons accelerated by high electric field provide energy to electrons in a valence band. The electrons in the valence band receive energy and they are excited from, the valence band, to a conduction band. Therefore, holes are left in the valence band. Consequently, electron-hole pairs are produced. Such impact ionization continuously takes place so that the number of carriers increases similarly to occurrence of an avalanche. A voltage ⅔ times as high as voltage $V_{breakdown}$ at which breakdown is produced is defined as a reverse blocking voltage $V_{blocking}$.

Figure 5:
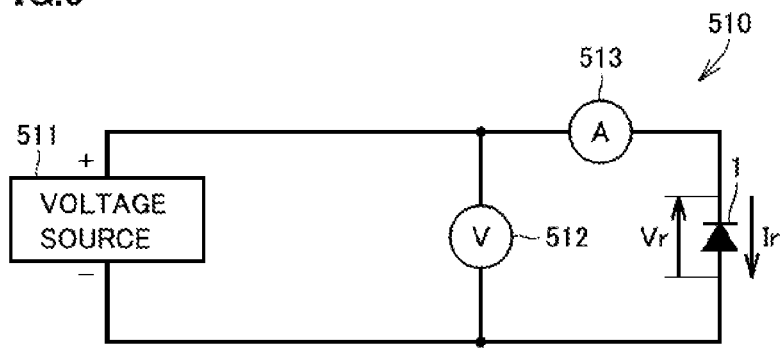
FIG. 5 is a diagram showing one example of a configuration for measuring the reverse current-reverse voltage characteristics of the diode.

FIG. 5 is a diagram showing one example of a configuration, for measuring reverse current-reverse voltage characteristics of the diode. Referring to FIG. 5, a measurement circuit 510 includes a voltage source 511, a voltmeter 512, and an ammeter 513. Voltage source 511 applies a reverse voltage Vc across the anode electrode and the cathode electrode of diode 1. Voltage source 511 can vary reverse voltage Vc. Voltmeter 512 measures reverse voltage Vc. Ammeter 513 measures a reverse current, Ir.

When breakdown is produced as described above, an excessive current flows through diode 1, and hence damage of diode 1 is highly likely. Therefore, voltage $V_{breakdown}$ may be measured in advance, for example, with the use of another sample fabricated in the same semiconductor substrate. Alternatively, measurement circuit 510 may have a current restriction function so as to be able to restrict a reverse current at voltage $V_{breakdown}$.

(3) Response Charges

Figure 6:
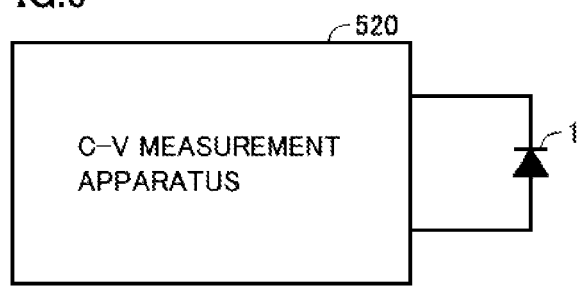
FIG. 6 is a diagram showing a schematic configuration of a circuit for measuring reverse capacitance-voltage (C-V) characteristics of the diode.
Figure 7:
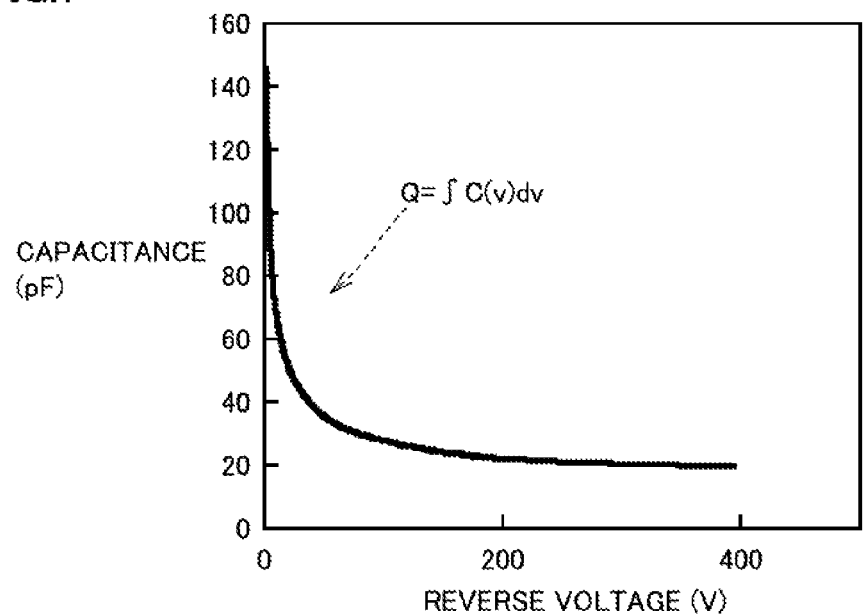
FIG. 7 is a diagram showing an example of reverse capacitance-voltage characteristics of the diode.

Response charges Q of diode 1 can be measured based on reverse capacitance-voltage (C-V) characteristics of diode 1. FIG. 6 is a diagram showing a schematic configuration of a circuit for measuring reverse capacitance-voltage (C-V) characteristics of the diode. FIG. 7 is a diagram showing an example of the reverse capacitance-voltage characteristics of the diode.

Referring to FIGS. 6 and 7, a C-V measurement apparatus 520 measures reverse capacitance-voltage characteristics of diode 1.

In this Example, a measurement frequency was set to 1 MHz Response charges Q were found by integrating a capacitance C in an integration range from 0 to $V_{blocking}$, that is, Q=∫C(V)dv (an integral interval: 0 to $V_{blocking}$).

<Evaluation Results>

(1) R-Q Characteristics

Figure 8:
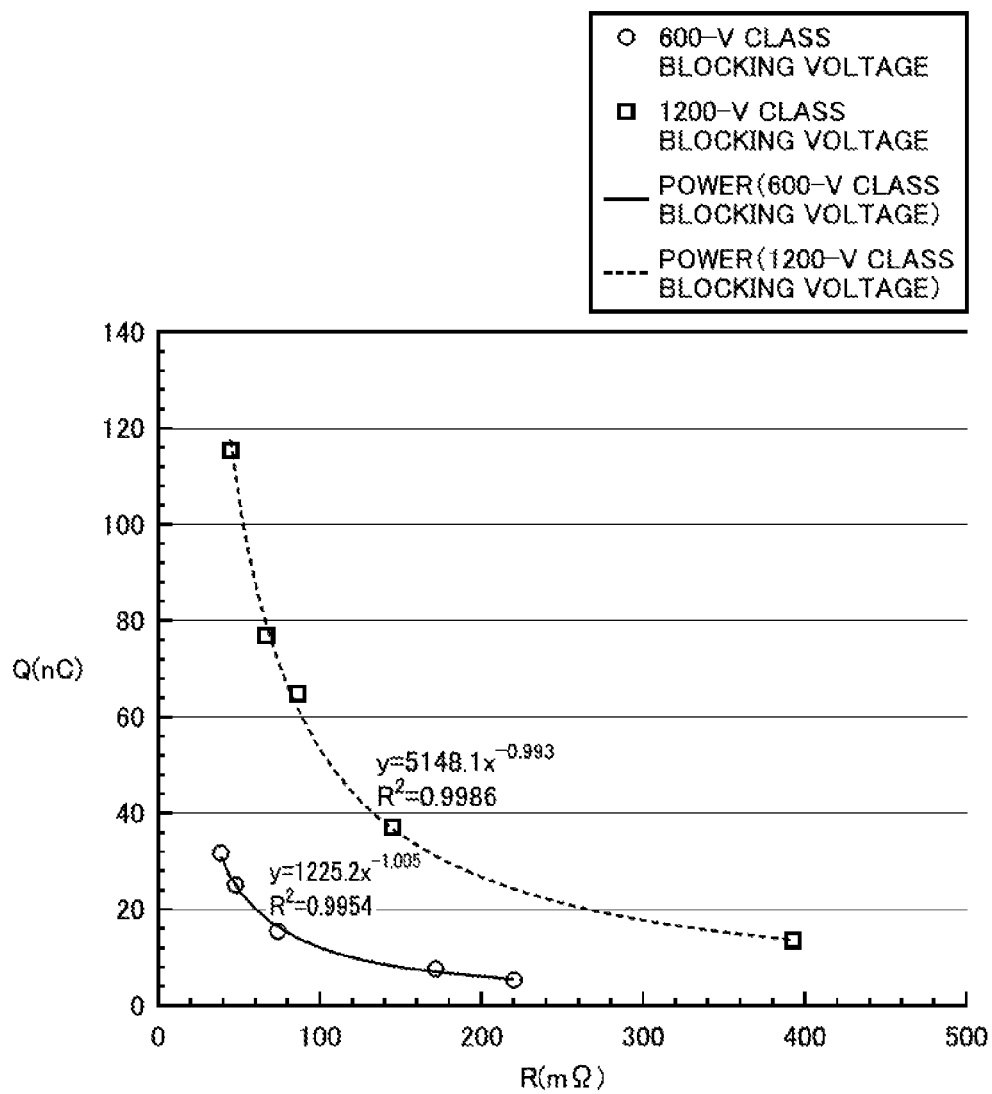
FIG. 8 is a diagram showing ON resistance R-response charge Q characteristics of five samples in each of Example 1-1 (a 600-V class blocking voltage device) and Example 1-2 (a 1200-V class blocking voltage device).

FIG. 8 is a diagram showing ON resistance R-response charge Q characteristics of five samples in each of Example 1-1 (a 600-V class blocking voltage device) and Example 1-2 (a 1200-V class blocking voltage device). Referring to FIG. 8, according to a sample in each Example, ON resistance R and response charges Q satisfy relation of substantially inverse proportion to each other. Namely, relation of $y=ax^b$ (a representing a constant, b≈−1) is derived, where y represents charges Q and x represents ON resistance R. A product (y×x) of ON resistance R and charges Q can be regarded as being substantially equal to a constant value a. A product R•Q of ON resistance R and charges Q is hereinafter also called an "RQ product".

The R-Q characteristics can be explained as below. Initially, ON resistance R of diode 1 can be expressed as in the Expression (1) below:

$$R=Rd+Rs+Rsub+Rc \quad (1)$$

where Rd represents a drift layer resistance, Rs represents a stop layer resistance, Rsub represents a substrate resistance, and Rc represents an ohmic electrode resistance.

In general, stop layer resistance Rs and ohmic electrode resistance Re are extremely lower than drift layer resistance Rd. Therefore, stop layer resistance Rs and ohmic electrode resistance Re can be ignored. Furthermore, drift layer resistance Rd is more dominant than substrate resistance Rsub. Therefore, as shown in the Expression (2), ON resistance R can be approximated to drift layer resistance Rd.

$$R \sim Rd \quad (2)$$

Drift layer resistance Rd can be expressed as in the Expression (3):

$$Rd=\rho \cdot d/A \quad (3)$$

where ρ represents drift layer resistivity, d represents a drift layer thickness, and A represents a junction area. The Expression (3) can be transformed as in the Expression (4) below:

$$Rd=1/(n \cdot \mu \cdot q) \cdot d/A \quad (4)$$

where n represents a drift layer carrier concentration and μ represents drift layer mobility.

Then, a phenomenon of reverse recovery response is considered. A forward current flows through the diode by application of a forward bias voltage. Then, a reverse bias voltage is applied to the diode. Carriers (electrons) are pulled out of the drift layer and thus a depletion layer is formed. It is assumed that the drift layer is completely depleted.

Response charges Q relate to such change in state of the diode. Therefore, response charges Q are expressed as in the Expression (5) below.

$$Q=A \cdot q \cdot n \cdot d \quad (5)$$

From the Expression (4) and the Expression (5), response charges Q are expressed as in the Expression (6) below.

$$R \cdot Q=d^2/\mu \quad (6)$$

The Expression (6) represents that product R•Q of ON resistance R and response charges Q is determined by drift layer thickness d and drift layer mobility μ, without depending on junction area A.

On the other hand, it is also possible that the drift layer is not completely depleted when a reverse bias voltage is applied to the diode. In this case, a thickness of the depletion layer formed in the drift layer at the time when the reverse bias voltage is applied to the diode is represented by d'. Response charges Q' are expressed as in the Expression (5') below.

$$Q'=A \cdot q \cdot n \cdot d' \quad (5')$$

From the Expression (4) and the Expression (5'), response charges Q' are expressed as in the Expression (6') below.

$$R \cdot Q'=d \cdot d'/\mu \quad (6')$$

As shown, in the Expression (6) and the Expression (6'), in both of a case that the drift layer is completely depleted and a case that the drift layer is partly depleted, an RQ product is not dependent on junction area A. FIG. 8 shows the RQ product represented by the Expression (6) and the Expression (6').

(2) RQ Product-$V_{blocking}$ Characteristics

Figure 9:
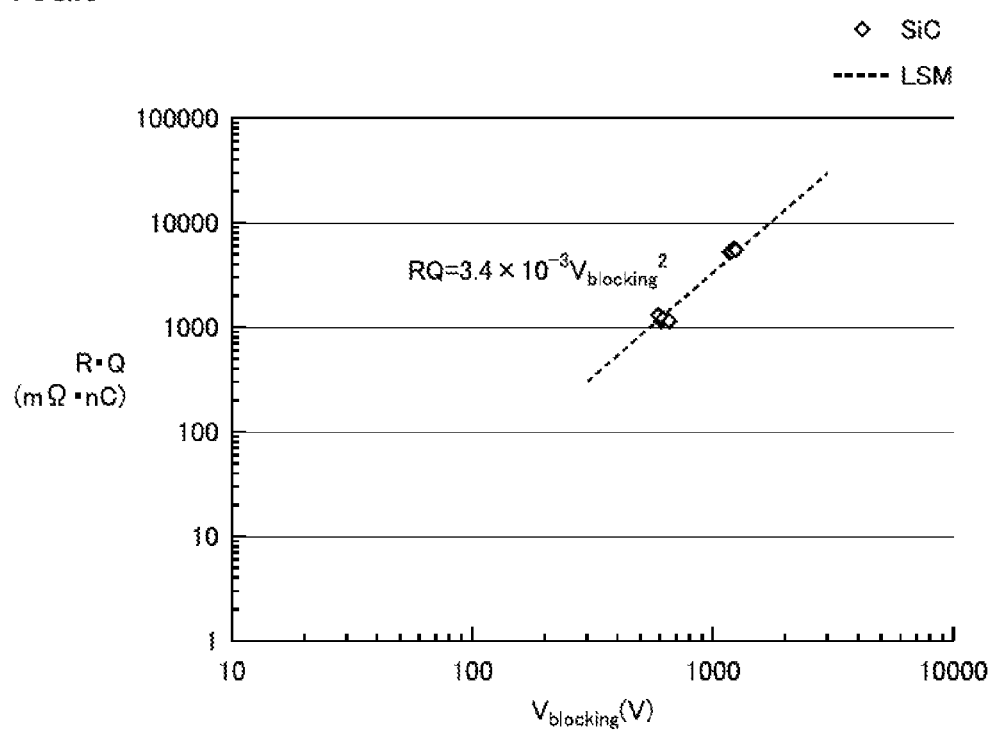
FIG. 9 is a diagram showing RQ product-$V_{blocking}$ characteristics of the samples according to Examples 1-1 and 1-2.

FIG. 9 is a diagram showing RQ product-$V_{blocking}$ characteristics of the samples according to Examples 1-1 and 1-2. Referring to FIG. 9, an RQ product is substantially determined by a value for reverse blocking voltage $V_{blocking}$.

Relation between an RQ product and reverse blocking voltage $V_{blocking}$ can be explained as below. Critical electric field intensity of a semiconductor material is represented by Ec and a thickness of the drift layer is represented by d. An avalanche breakdown voltage $V_{breakdown}$ of the diode can be expressed as in the Expression (7) below.

$$V_{breakdown} = Ec \cdot d/2 \quad (7)$$

From the Expression (7) and the Expression (6), an RQ product can be expressed as in the Expression (8).

$$R \cdot Q = 4/(\mu \cdot Ec^2) \cdot V_{breakdown}^2 \quad (8)$$

Reverse blocking voltage $V_{blocking}$ is considered to be in proportion to avalanche breakdown voltage $V_{breakdown}$. Therefore, as shown in the Expression (9), an RQ product is considered to be in proportion to a square of reverse blocking voltage $V_{blocking}$.

$$R \cdot Q \propto V_{blocking}^2 \quad (9)$$

Regarding the samples according to Examples 1-1 and 1-2 shown in FIG. 9 as well, an RQ product is in proportion to a square of reverse blocking voltage $V_{blocking}$. From an RQ product and reverse blocking voltage $V_{blocking}$ in each sample, the following relational expression was obtained with least squares method fitting (LSM).

$$R \cdot Q = 3.4 \times 10^{-3} (m\Omega \cdot nC/V^2) \cdot V_{blocking}^2$$

A loss in the diode is the sum of a conduction loss and a switching loss. The conduction loss is constituted of a loss in the on state of the diode (an ON loss) and a loss in the off state (an OFF loss). In the conduction loss, however, the ON loss is dominant. As expressed in the Expression (10), an ON loss Eon becomes greater in proportion to ON resistance R. α represents a proportionality constant.

$$Lon = \alpha R \quad (10)$$

A switching loss is constituted of a turn-on loss and a turn-off loss. In the switching loss, however, the turn-off loss is dominant. As expressed in the Expression (11), a turn-off loss Ltf is in proportion to charges Q. β represents a proportionality constant.

$$Ltf = \beta Q \quad (11)$$

A total loss Lt in the diode is represented as the sum of ON loss Lon and turn-off loss Ltf. Therefore, total loss Lt can be expressed as in the Expression (12). Here, C represents a constant.

$$Lt = Lon + Ltf = \alpha R + \beta Q = \alpha R + \beta C/R \quad (12)$$

When ON resistance R is set to $R^* = (\beta/\alpha \cdot C)^{1/2}$ and response charges Q are set to $Q^* = (\alpha/\beta \cdot C)^{1/2}$, total loss Lt attains to a minimum value Lt*. Minimum value Lt* can be expressed as in the Expression (13) below.

$$Lt^* = 2(\alpha \cdot \beta \cdot R^* \cdot Q^*)^{1/2} \quad (13)$$

Namely, a minimum value for total loss Lt is in proportion to a square root of an RQ product. This indicates that an RQ product is a good indicator representing a total loss in the diode.

Furthermore, dependency of an RQ product on a material will be considered based on the Expression (8). Regarding an Si material, an SiC material, and a GaN material, a ratio of a material limit of an RQ product can be expressed as in the Expression (14).

RQ material limit ratio (Si): RQ material limit ratio (SiC): RQ material limit ratio (GaN)=approximately 100: approximately 3:1 (14)

Therefore, the material limit ratio of the total loss can be expressed as in the Expression (15).

Total loss material limit ratio (Si): Total loss material limit ratio (SiC): Total loss material limit ratio (GaN)=10 (Si): 2 (SiC): 1 (GaN) (15)

Example 1-3

600-V Class SiC-SBD

A sample according to Example 1-3 was fabricated with a method the same as the method of fabricating the sample according to Example 1-1. A structure of an epitaxial layer was the same as the structure in Example 1-1. An area of a junction interface was set to be constant and a GR width was varied. Specifically, an area of the junction interface was set to 0.5 mm² which was the same as the area of the junction interface in Sample 1 according to Example 1-1. As shown in Table 3, samples of which GR widths were varied from 0 (without guard ring) to 800 μm were prepared. In Samples 5 to 9 having a large GR width, a total GR width was designed such that a condition of (total GR width)=(GR width)+30 μm was satisfied.

TABLE 3

| | Sample 1 | Sample 2 | Sample 3 | Sample 4 | Sample 5 | Sample 6 | Sample 7 | Sample 8 | Sample 9 |
|---|---|---|---|---|---|---|---|---|---|
| GR width (μm) | 15 | 0 | 3 | 5 | 50 | 100 | 200 | 400 | 800 |

Example 1-4

1200-V Class SiC-SBD

A sample according to Example 1-4 was fabricated with a method the same as the method of fabricating the sample according to Example 1-2. A structure of an epitaxial layer was the same as the structure in Example 1-2. An area of a junction interface was set to be constant and a GR width was varied. Specifically, an area of the junction interlace was set to 0.5 mm² which was the same as the area of the junction interface in Sample 1 according to Example 1-2. As shown in Table 4, samples of which GR widths were varied from 0 (without guard ring) to 800 μm were prepared. In Samples 5 to 9 having a large GR width, a total GR width was designed such that a condition of (total GR width)–(GR width)+30 μm was satisfied.

TABLE 4

|  | Sample 1 | Sample 2 | Sample 3 | Sample 4 | Sample 5 | Sample 6 | Sample 7 | Sample 8 | Sample 9 |
|---|---|---|---|---|---|---|---|---|---|
| GR width (μm) | 30 | 0 | 3 | 5 | 50 | 100 | 200 | 400 | 800 |

<Evaluation Method>

ON resistance R, reverse blocking voltage $V_{blocking}$, and response charges Q of the samples according to Examples 1-3 and 1-4 were measured with a method the same as the method of evaluating the samples according to Examples 3-1 and 1-2.

Therefore, details of the evaluation, method will not be repeated.

<Results of Evaluation>

Figure 10:
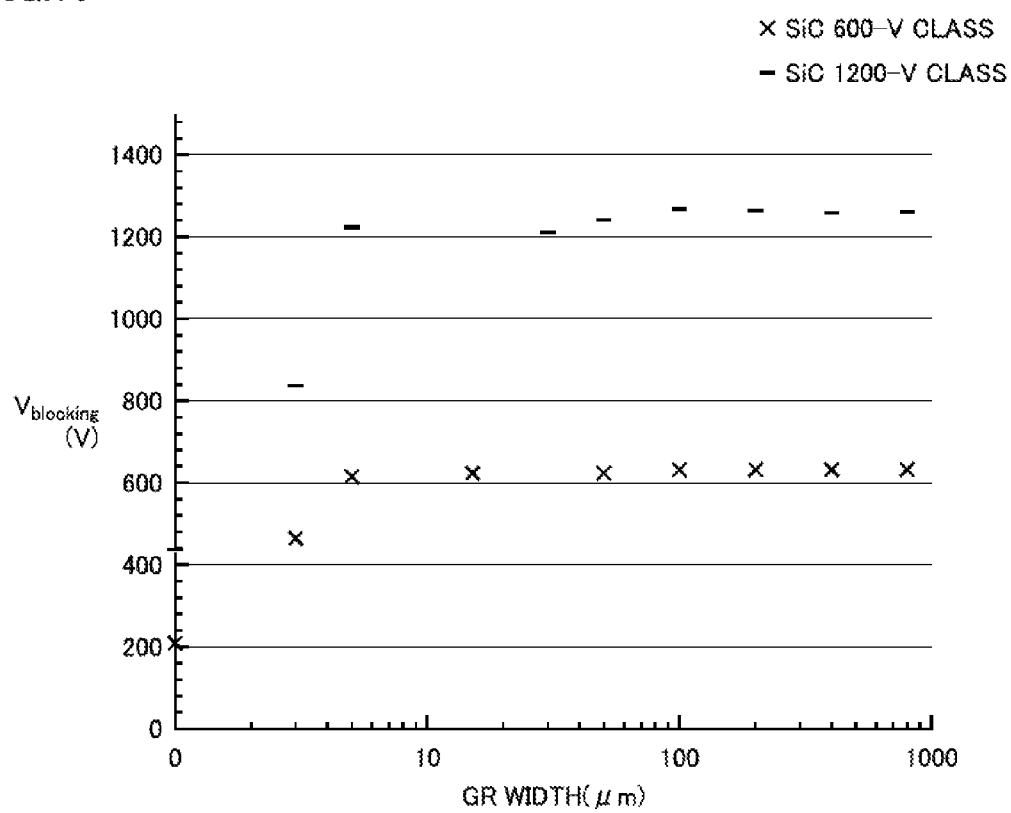
FIG. 10 is a diagram showing GR width-reverse blocking voltage characteristics of samples according to Examples 1-3 and 1-4.

FIG. 10 is a diagram showing a GR width-reverse blocking voltage characteristics of the samples according to Examples 1-3 and 1-4. Referring to FIG. 10, in a sample without a guard ring (having a GR width of 0) and a sample having a GR width of 3 μm, reverse blocking voltage $V_{blocking}$ lowered. The abscissa in the graph in FIG. 10 represents a logarithm. The logarithm cannot express the GR width being 0. In FIG. 10 (and also subsequent drawings), however, a GR width in a case without a guard ring is expressed as 0 for the sake of convenience.

In the case of Example 1-3, in a sample having a GR width not smaller than 5 pin, reverse blocking voltage $V_{blocking}$ was approximately 600 V and good results were obtained. Similarly in Example 1-4 as well, in a sample having a GR width not smaller than 5 μm, reverse blocking voltage $V_{blocking}$ was approximately 1200 V and good results were obtained.

When the GR width was not greater than 3 μm, it is considered that a leakage current increased and reverse blocking voltage $V_{blocking}$ lowered because an effect to relax concentration of electric field owing to a guard ring structure was weakened.

Furthermore, as shown in Table 5, in any of Examples 3-3 and 1-4, ON resistance R hardly changed depending on a GR width.

TABLE 5

|  | Sample 1 | Sample 2 | Sample 3 | Sample 4 | Sample 5 | Sample 6 | Sample 7 | Sample 8 | Sample 9 |
|---|---|---|---|---|---|---|---|---|---|
| Example 1-3 |  |  |  |  |  |  |  |  |  |
| ON Resistance (mΩ) | 223 | 230 | 227 | 230 | 224 | 226 | 229 | 231 | 225 |
| Example 1-4 |  |  |  |  |  |  |  |  |  |
| ON Resistance (mΩ) | 396 | 395 | 402 | 404 | 402 | 405 | 407 | 401 | 404 |

Figure 11:
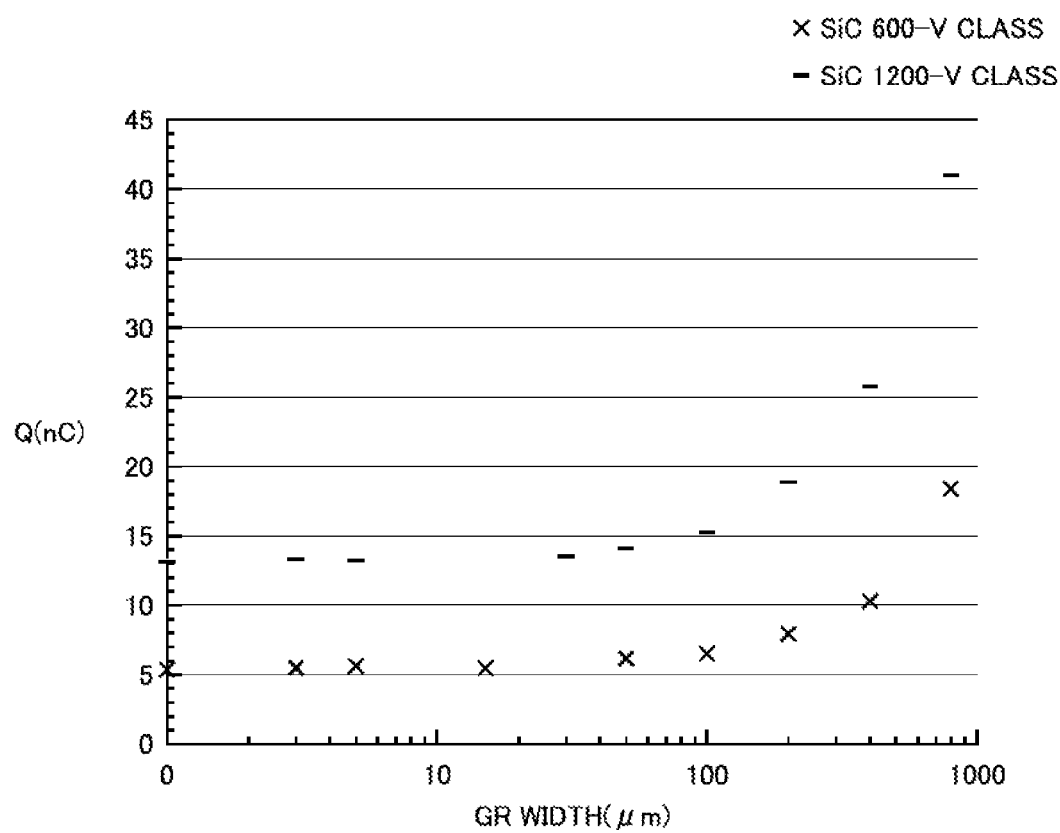
FIG. 11 is a diagram showing GR width-response charge Q characteristics of the samples according to Examples 1-3 and 1-4.

FIG. 11 is a diagram showing GR width-response charge Q characteristics of the samples according to Examples 1-3 and 1-4. Referring to FIG. 11, in both of Examples 1-3 and 1-4, in the samples having a GR width from 0 to 50 μm, response charges Q are substantially constant. When a GR width was set to 100 μm, response charges Q slightly increased. A rate of increase in response charges Q was approximately 20%. When a GR width was not smaller than 100 μm, response charges Q significantly increased. It is considered that, when a GR width, is great, charges originating from a guard ring region are unignorable as compared with charges originating from a Schottky electrode region, and hence total charges increase.

Figure 12:
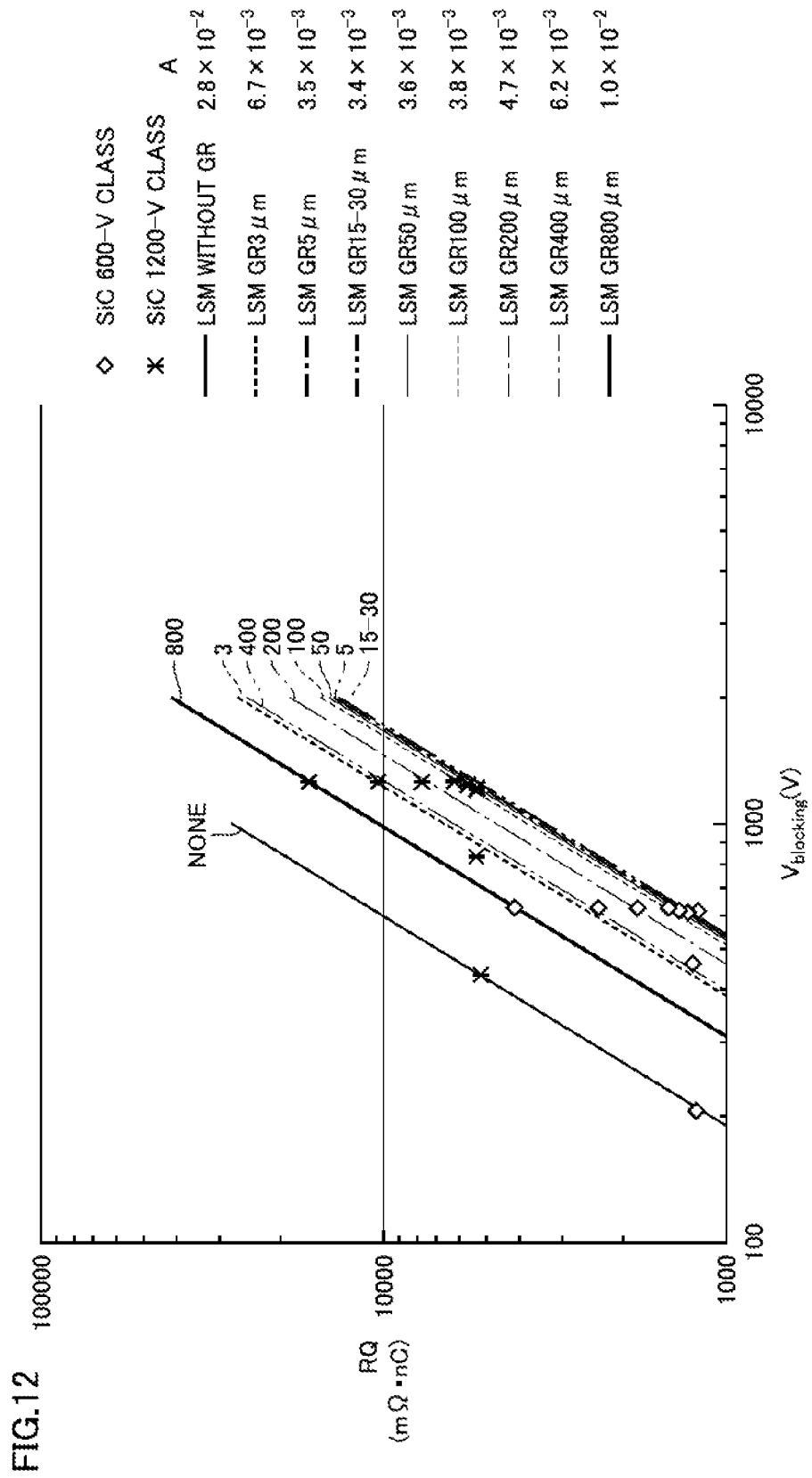
FIG. 12 is a diagram showing GR width dependency of the RQ product-reverse blocking voltage $V_{blocking}$ characteristics.
Figure 13:
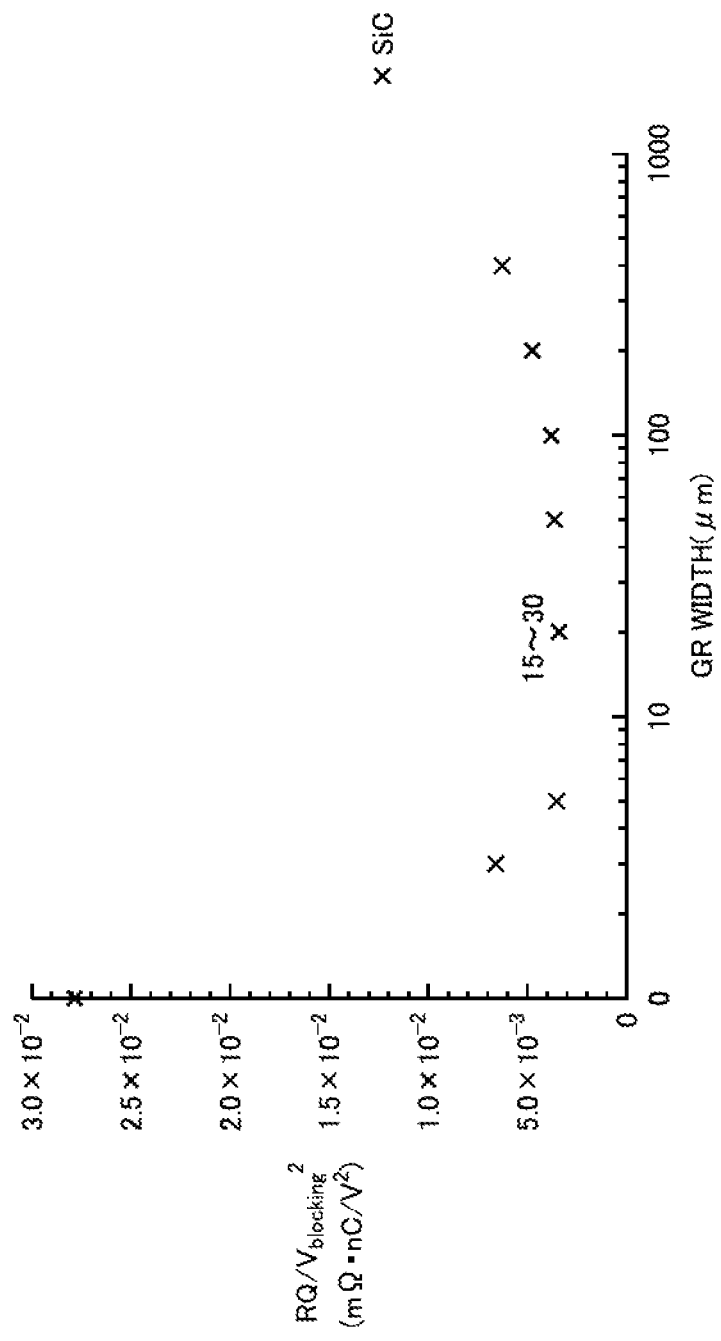
FIG. 13 is a diagram showing GR width dependency of a factor of proportionality A shown in FIG. 12.

FIG. 12 is a diagram showing GR width dependency of the RQ product-reverse blocking voltage $V_{blocking}$ characteristics. In the relation shown in the Expression (9), an RQ product is in proportion to a square of reverse blocking voltage $V_{blocking}$. FIG. 13 is a diagram showing GR width dependency of a factor of proportionality A shown in FIG. 12. Referring to FIG. 13, when a GR width, is not larger than 3 μm, reverse blocking voltage $V_{blocking}$ lowered and A increased. In other words, the RQ product-reverse blocking voltage $V_{blocking}$ characteristics deteriorated. When a GR width was in a range from 5 to 200 μm, A attained to substantially a minimum value and it was substantially constant. When a GR width exceeded 200 μm, the RQ product started to increase and hence the RQ product-reverse blocking voltage $V_{blocking}$ charactersties deteriorated.

The sample according to Example 1-3 was employed as a sample having a GR width of 15 μm. The sample according to Example 1-4 was employed as a sample having a GR width of 30 μm. As above, in a range of a GR width from 15 to 30 μm, the RQ product attains to the minimum. Based on data of these two samples, values for factor A in a case that the GR width was set to 20 μm were plotted in FIG. 13.

From the Expression (13), total loss Lt in the diode is in proportion to a square root of an RQ product. When a GR width is not larger than 200 μm, increase in total loss Lt can be suppressed to 20% or lower. From the foregoing, an optimal range for a GR width is not smaller than 5 μm and not larger than 200 μm. An RQ product here can be expressed as in the Expression (16) below.

$$RQ \leq 4.7 \times 10^{-3} (m\Omega \cdot nC/V^2) \cdot V_{blocking}^2 \quad (16)$$

The discussion above is applicable also to an edge-termination, structure other than the guard ring. An appropriate range of a length of such an edge-termination structure is again not smaller than 5 μm and not larger than 200 μm.

In a switching circuit, reduction in loss is required. A loss in the switching circuit mainly includes a conduction loss and a switching loss.

The conduction loss is a product of a current and a voltage in the on state of a switching element. The switching loss is caused at the time when the switching element is turned on and off. The switching loss increases in proportion to a switching frequency.

Therefore, in a power diode, both of an ON resistance loss and a switching loss should be taken into account.

According to the first embodiment, a product R•Q (an RQ product) of ON resistance R of the diode and response charges Q of the diode can be employed as an indicator for performance of the diode. Specifically, the RQ product can be employed as an indicator for a total loss in the diode.

According to the first embodiment, a minimum RQ product cart be obtained by employing SiC as a material for the diode and optimizing a structure of the epitaxial layer and a device structure. Therefore, according to the first embodiment, a diode having excellent switching characteristics can be provided.

Second Embodiment

Element Structure

Figure 14:
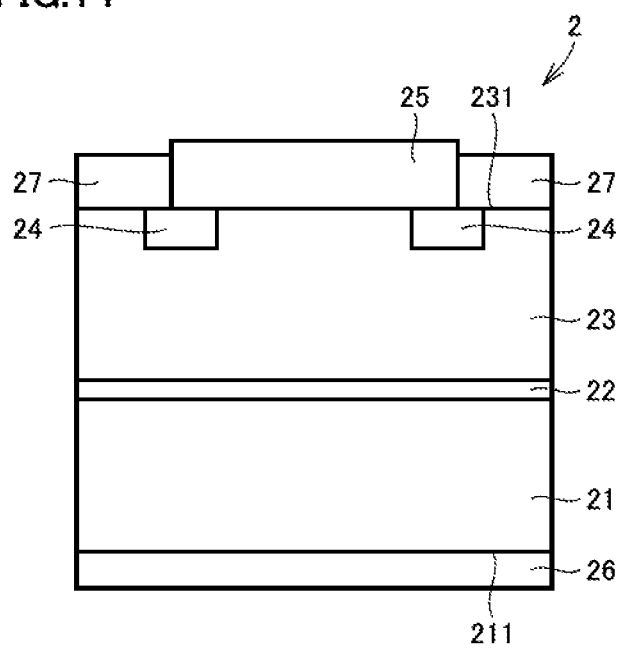
FIG. 14 is a cross-sectional view schematically showing a structure of a diode according to a second embodiment.

A diode according to a second embodiment is a Schottky barrier diode composed of silicon (Si). FIG. 14 is a cross-sectional view schematically showing a structure of the diode according to the second embodiment.

Referring to FIG. 14, a diode 2 includes a silicon substrate 21, a stop layer 22, a drift layer 23, a guard ring 24, a Schottky electrode 25, an ohmic electrode 26, and a surface protecting film 27.

Since the structure shown in FIG. 14 is basically the same as the structure shown in FIG. 1, detailed description will not be repeated. Diode 2 according to the second embodiment is different from diode 1 according to the first embodiment in a semiconductor material.

Manufacturing Process

Example 2-1

150-V Class Si-SBD

One example of conditions for forming diode 2 shown in FIG. 14 is described. The conditions described below are conditions, for example, for forming a 150-V class Si-SBD.

Initially, silicon substrate 21 of the n-type having resistivity of $2\times10^{-3}$ (Ω•cm) was prepared. N-type stop layer 22 having a thickness of 0.5 μm, in which a concentration of a donor was $2\times10^{18}$ cm$^{-3}$, was formed on silicon substrate 21 with an epitaxial method, and then n-type drift layer 23 having a thickness of 10 μm, in which a concentration of a donor was $8\times10^{14}$ cm$^{-3}$, was formed on stop layer 22. A substrate constituted of silicon substrate 21, stop layer 22, and drift layer 23 is hereinafter also called a "silicon epitaxial substrate."

An oxide film was formed on a surface of drift layer 23 through heat treatment in an oxygen atmosphere. This oxide film corresponds to surface protecting film 27 in FIG. 14. A temperature for heat treatment, was set to 1100° C. Then, photolithography and etching with a BHF etchant was successively carried out. Thus, the oxide film in a portion where a guard ring region is to be formed was removed and a window for diffusion of the p-type was formed. In an oxygen atmosphere, boron (B) was diffused into the silicon epitaxial substrate with the use of the oxide film as a mask. Guard ring 24 was thus formed. Guard ring 24 is a p-type region having a surface concentration of $1\times10^{19}$ cm$^{-3}$ and a depth of 2 μm. A total GR width was 50 μm.

Ohmic electrode 26 was formed with EB evaporation. Ohmic electrode 26 is a film having a three-layered structure constituted of a Ti film/an Ni film/an Au film.

Then, a window for Schottky electrode 25 was formed in the oxide film (surface protecting film 27) by photolithography and etching with BHF. Schottky electrode 25 was formed such that end portions of Schottky electrode 25 lie over across guard ring 24 (design of overlapping of 20 μm). As in the first embodiment, three samples different in junction interface area were fabricated (see Table 6).

TABLE 6

|  | Sample 1 | Sample 2 | Sample 3 |
|---|---|---|---|
| Junction Interface Area (mm$^2$) | 3.9 | 6.5 | 13.0 |

Thereafter, with EB evaporation, Schottky electrode 25 constituted of a molybdenum (Mo) film and an Ai film was formed. Schottky electrode 25 was formed with lift-off. Thereafter, ohmic electrode 26 constituted of a Ti film/an Ni film/an Au film was formed on a back surface of the silicon epitaxial substrate (a surface 211 of silicon substrate 21).

The silicon epitaxial substrate above was diced into chips. The chip was mounted on a package through die-bonding and wire-bonding. Die-bonding was carried out with the use of Sn—Ag solder at 230° C. Wire-bonding was carried out with the use of an Al wire.

Example 2-2

80-V Class Si-SBD

A 80-V class Si-SBD was fabricated with some conditions in the manufacturing process in Example 2-1 (the 80-V class Si-SBD) being modified. Specifically, a concentration of a donor in drift layer 23 was set to $1.5\times10^{15}$ cm$^{-3}$ and a thickness of drift layer 23 was set to 5 μm. Furthermore, as shown in Table 7, three types of samples different in junction interface area were prepared by changing a size of Schottky electrode 25.

TABLE 7

|  | Sample 1 | Sample 2 | Sample 3 |
|---|---|---|---|
| Junction Interface Area (mm$^2$) | 2.1 | 3.5 | 6.9 |

Since other conditions are the same as the conditions in the manufacturing process in Example 2-1, subsequent description will not be repeated.

Example 2-3

40-V Class Si-SBD

A 40-V class Si-SBD was fabricated with some conditions in the manufacturing process in Example 2-1 (the 150-V class Si-SBD) being modified. Specifically, a concentration of a donor in drift layer 23 was set to $3\times10^{15}$ cm$^{-3}$ and thickness of drift layer 23 was set to 3 μm. Furthermore, as shown in Table 8, three types of samples different injunction interface area were prepared by changing a size of Schottky electrode 25.

TABLE 8

|  | Sample 1 | Sample 2 | Sample 3 |
|---|---|---|---|
| Junction Interface Area (mm²) | 1.0 | 1.7 | 3.5 |

Since other conditions are the same as the conditions in the manufacturing process in Example 2-1, subsequent description will not be repeated.

<Evaluation Method>

ON resistance R, a reverse blocking voltage, and response charges Q were measured with an evaluation method the same as the method according to the first embodiment. Therefore, details of the evaluation method will not be repeated.

<Results of Evaluation>

(1) R-Q Characteristics

Figure 15:
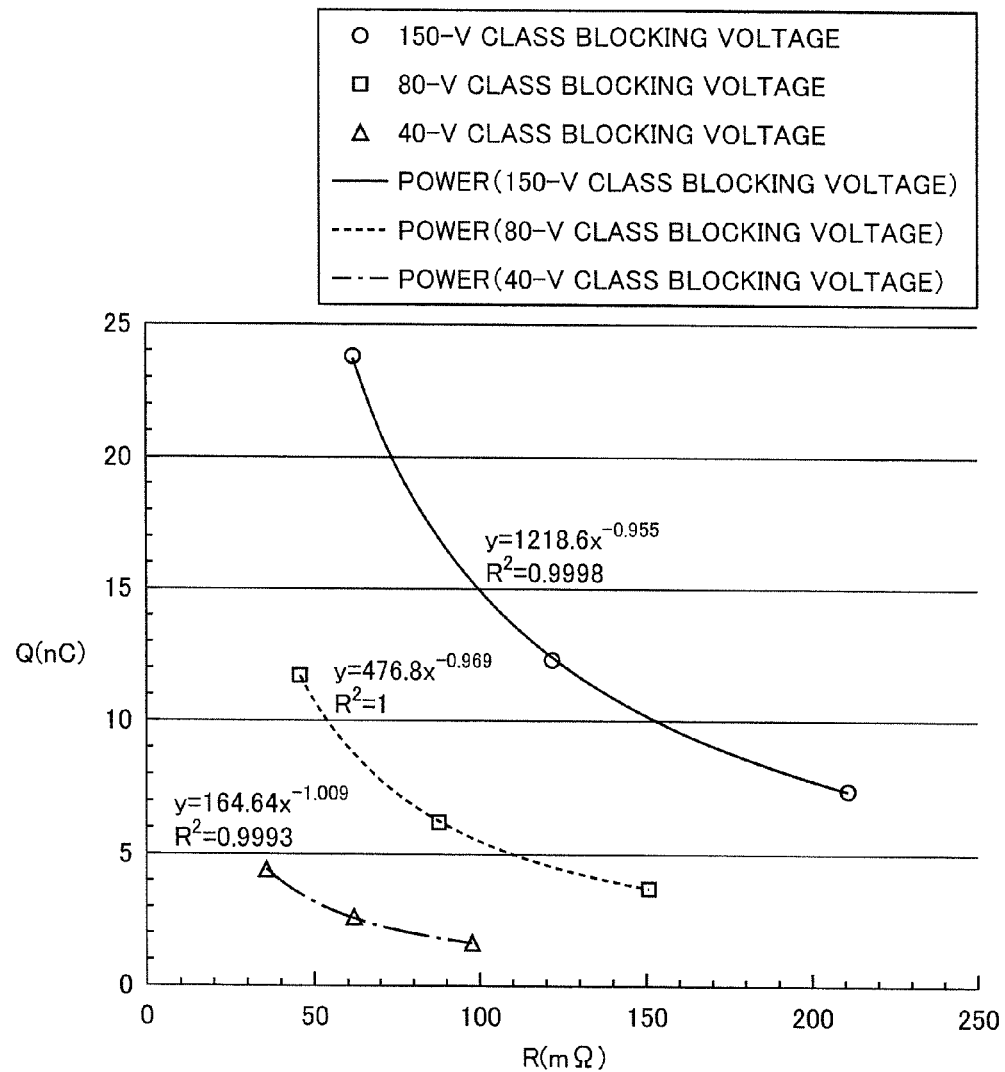
FIG. 15 is a diagram showing ON resistance R-response charge Q characteristics of samples according to Example 2-1 (a 150-V class blocking voltage device), Example 2-2 (a 80-V class blocking voltage device), and Example 2-3 (a 40-V class blocking voltage device).

FIG. 15 is a diagram showing ON resistance R-response charge Q characteristics of the samples according to Example 2-1 (a 150-V class blocking voltage device). Example 2-2 (a 80-V class blocking voltage device), and Example 2-3 (a 40-V class blocking voltage device). Referring to FIG. 15, according to the sample in each Example, ON resistance R and response charges Q satisfy relation of substantially inverse proportion to each other. Such relation can be understood from the Expression (6) and the Expression (6').

(2) RQ Product-$V_{blocking}$ Characteristics

Figure 16:
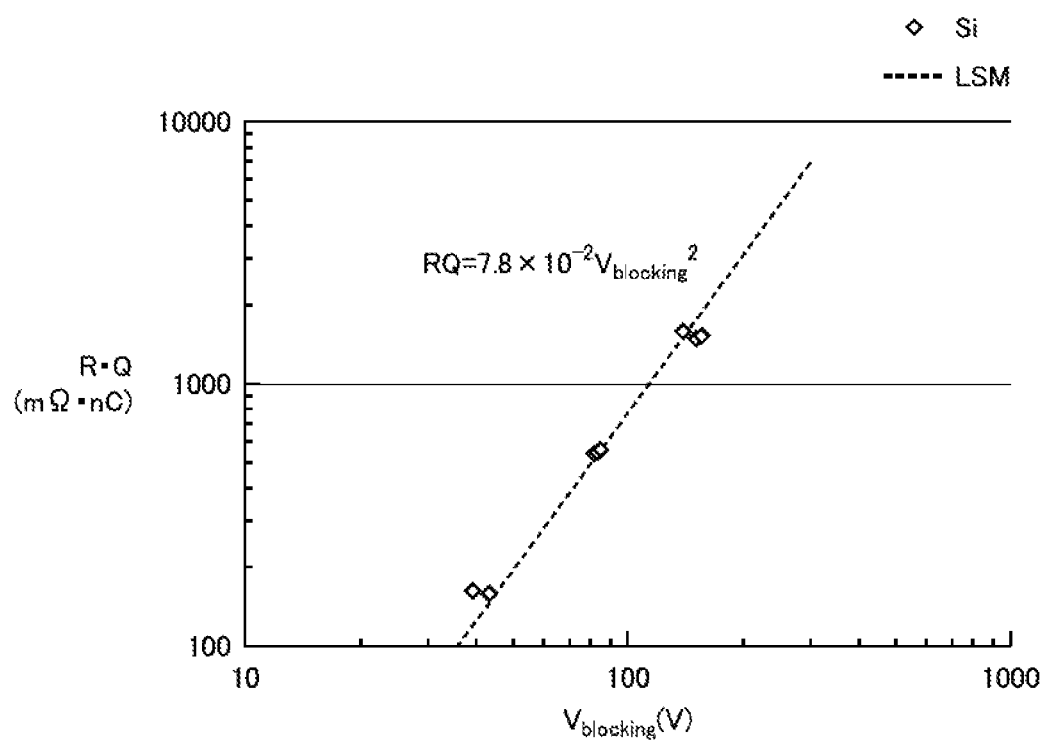
FIG. 16 is a diagram showing RQ product-$V_{blocking}$ characteristics of the samples according to Examples 2-1 to 2-3.

FIG. 16 is a diagram showing RQ product-$V_{blocking}$ characteristics of the samples according to Examples 2-1 to 2-3. Referring to FIG. 16, an RQ product is substantially determined by a value for reverse blocking voltage $V_{blocking}$. By subjecting a measurement value of the RQ product to least squares method fitting in accordance with the Expression (9), the following relational expression was obtained.

$$R \cdot Q = 7.8 \times 10^{-2} (m\Omega \cdot nC/V^2) \cdot V_{blocking}^2$$

A value for an RQ product in accordance with the expression above is a value obtained by optimizing a structure of a silicon epitaxial layer (drift layer 23 and stop layer 22) or an edge-termination structure. Change in RQ product with these values will be explained with, reference to a next, embodiment.

Third Embodiment

A diode according to a third embodiment is a Schottky barrier diode composed of silicon (Si). Since a configuration, of the diode according to the third embodiment is same as the structure shown, in FIG. 14, subsequent description will not be repeated. The diode according to the third embodiment is different from the diode according to the second embodiment in change in structure of the silicon epitaxial layer (drift layer 23 and stop layer 22) and overlapping width between guard ring 24 and Schottky electrode 25.

As shown in Table 9, Samples 1 to 7 were prepared. Sample 1 is a diode formed under the same conditions as those for the diode according to the second embodiment. Namely, in Sample 1, thickness d of drift layer 23 and a GR width are optimized. Samples 2 to 4 are different from Sample 1 in thickness d of drift layer 23. Samples 5 to 7 are different from Sample 1 in overlapping width of guard ring 14 (in other words, a GR width).

TABLE 9

|  | Sample 1 | Sample 2 | Sample 3 | Sample 4 | Sample 5 | Sample 6 | Sample 7 |
|---|---|---|---|---|---|---|---|
| Drift Layer Thickness (μm) | 5 | 10 | 20 | 2 | 5 | 5 | 5 |
| GR width (μm) | 20 | 20 | 20 | 20 | 5 | 100 | 300 |

Sample 6 and Sample 7 have a large GR width. For Sample 6 and Sample 7, a total GR width was designed such that the total GR width was set to a GR width+30 μm. Since other conditions are the same as the conditions in the manufacturing process in Examples 2-1 and 2-2, subsequent description will not be repeated.

<Evaluation Method>

ON resistance R, a reverse blocking voltage, and response charges Q were measured with an evaluation method the same as the method according to the first embodiment. Therefore, details of the evaluation method will not be repeated.

<Results of Evaluation>

Figure 17:
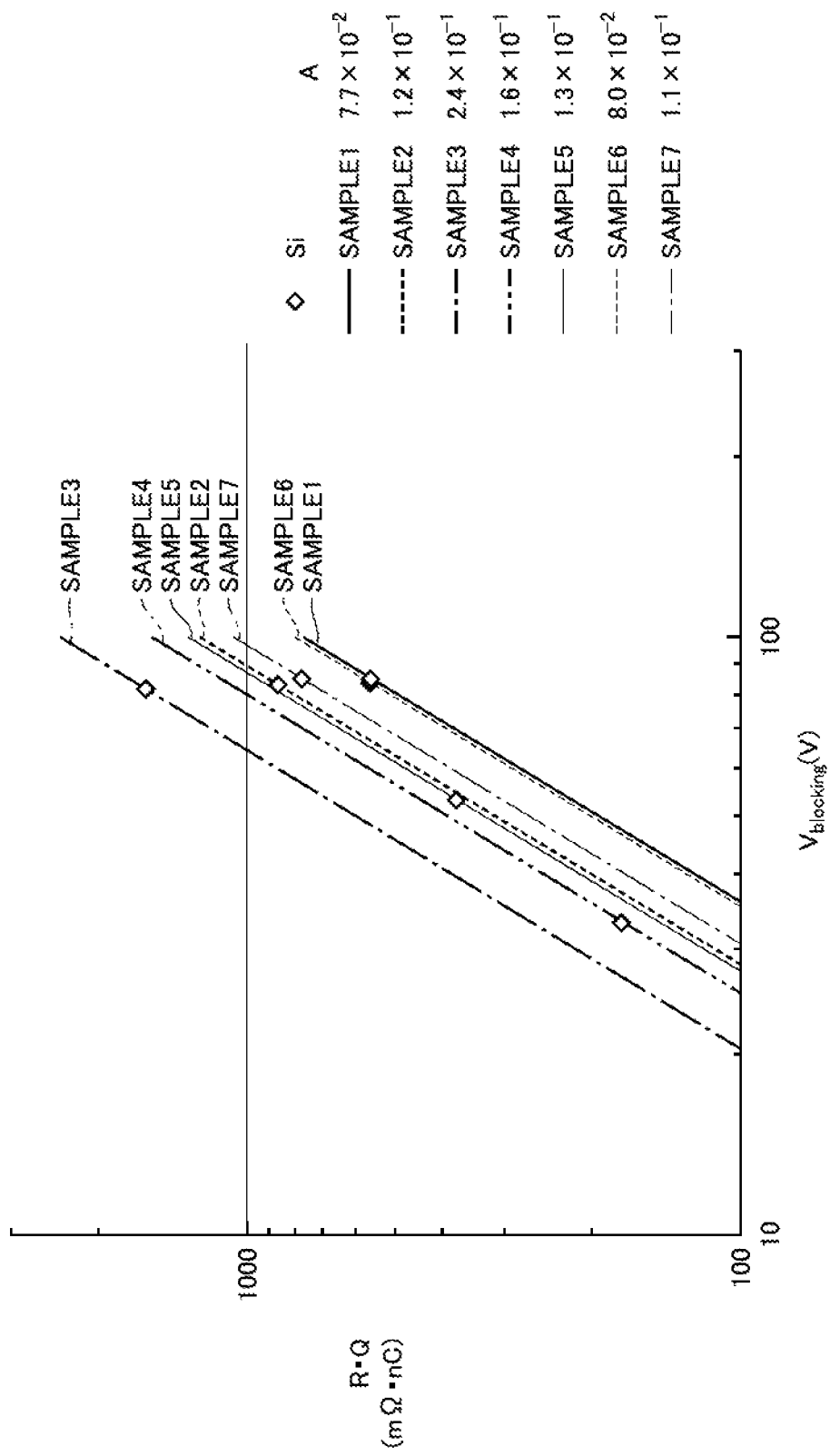
FIG. 17 is a diagram showing GR width dependency of RQ product-reverse blocking voltage $V_{blocking}$ characteristics.

FIG. 17 is a diagram showing GR width dependency of RQ product-reverse blocking voltage $V_{blocking}$ characteristics. Referring to FIG. 17, Sample 2 and Sample 3 were poorer in RQ characteristics than Sample 1. Specifically, for the same reverse blocking voltage $V_{blocking}$, the RQ product of Sample 2 or Sample 3 increased as compared with the RQ product of Sample 1.

As shown in Table 9, Sample 2 and Sample 3 are greater in thickness of the drift layer than Sample 1. The reason why the RQ product of each of Sample 2 and Sample 3 increased as compared with the RQ product of Sample 1 may be because, owing to increase in thickness of drift layer 23 as compared with an optimal thickness, ON resistance R increased although reverse blocking voltage $V_{blocking}$ remained the same.

Reverse blocking voltage $V_{blocking}$ and response charges Q each represent reverse bias characteristics. Reverse blocking voltage $V_{blocking}$ is dependent on electric field intensity at an interface of the Schottky electrode. Response charges Q are dependent on a width, of a depletion layer formed in the drift layer. When the drift layer has a thickness larger than an optimal thickness, electric field intensity at the interlace and a width of the depletion layer are not affected by the thickness of the drift layer. On the other hand, an ON resistance increases with increase in thickness of the drift layer.

Sample 4 is smaller in thickness of the drift layer than Sample 1. A blocking-voltage of Sample 4 lowered as compared with the blocking voltage of Sample 1. Response charges Q and ON resistance R of Sample 4 decreased as compared with response charges Q and ON resistance R of Sample 1. Consequently, RQ product-reverse blocking voltage $V_{blocking}$ characteristics of Sample 4 were slightly poorer than, the RQ product-reverse blocking voltage $V_{blocking}$ characteristics of Sample 1, An RQ product is basically in proportion to a square of reverse blocking voltage $V_{blocking}$ (see the Expression (9)). Therefore, Sample 4 and Sample 1 were compared with each other based on $RQ/V_{blocking}^2$, that is, factor of proportionality A. As factor of proportionality A is smaller, the RQ product-reverse blocking voltage $V_{blocking}$ characteristics are better.

Sample 5 has a GR width of 5 μm. Sample 5 was lower in blocking voltage than Sample 1. Furthermore, response charges Q of Sample 5 slightly lowered as compared with the response charges of Sample 1. Consequently, the RQ product-reverse blocking voltage $V_{blocking}$ characteristics of Sample 5 were slightly poorer than the RQ product-reverse blocking voltage $V_{blocking}$ characteristics of Sample 1.

Sample 6 has a GR width of 100 μm. A value for factor of proportionality A of Sample 6 was substantially the same as that of Sample 1. Sample 7 has a GR width of 300 μm. As compared with Sample 1, Sample 7 has significantly increased response charges Q. Consequently, factor of proportionality A was 0.11 (=1.1×10⁻¹), This value indicates approximately 43% increase as compared with the value for factor of proportionality A in Sample 1. Namely, the RQ product-reverse blocking voltage $V_{blocking}$ characteristics of Sample 7 were poorer than the RQ product-reverse blocking voltage $V_{blocking}$ characteristics of Sample 1.

A largest value for factor of proportionality A among Sample 1 to Sample 7 is 2.4×10⁻¹ (Sample 3). Based on Sample 1 to Sample 7, the upper limit of factor of proportionality A can be considered as 2.4×10⁻⁵. Consequently, the following relation of an RQ product is derived.

$$RQ/V_{blocking}^2 = A \leq 2.4 \times 10^{-1}$$

Namely, relation of $RQ \leq 0.24 \times V_{blocking}^2$ is satisfied.

Thus, it can be seen that a condition for optimizing an RQ product exists in a thickness of the drift layer (a structure of the epitaxial layer) and a GR width. The diode according to the second embodiment is an element formed under this optimal condition. By optimizing a thickness of the drift layer (a structure of the epitaxial layer) and a GR width, a rate of increase in RQ product can be suppressed to 43% or lower, in other words, a rate of increase in total loss Lt of the diode can be suppressed to 20% or lower. Such relation can be expressed in the Expression (17) below.

$$RQ \leq 0.1 \times V_{blocking}^2 \quad (17)$$

As set forth above, according to the second and third embodiments, by employing Si for a material for the diode and optimizing a structure of the epitaxial layer and a device structure, a minimum RQ product can be obtained. Therefore, according to the second and third embodiments, a diode having excellent switching characteristics can be provided as in the first embodiment.

Fourth Embodiment

Element Structure

Figure 18:
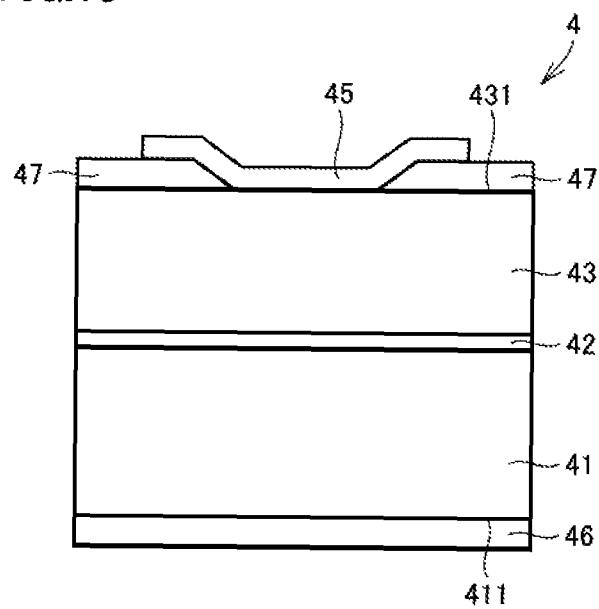
FIG. 18 is a cross-sectional view schematically showing a structure of a diode according to a fourth embodiment.

A diode according to a fourth embodiment is a Schottky barrier diode composed of gallium nitride (GaN). FIG. 18 is a cross-sectional view schematically showing a structure of the diode according to the fourth embodiment.

Referring to FIG. 18, a diode 4 includes a GaN substrate 41, a stop layer 42, a drift layer 43, a Schottky electrode 45, an ohmic electrode 46, and a surface protecting film 47. Since a basic structure of diode 4 is the same as the structure of diode 1 according to the first embodiment, subsequent description will not be repeated.

Manufacturing Process

Example 4-1

600-V Class GaN-SBD

One example of conditions for forming diode 4 shown in FIG. 18 is described. The conditions described below are conditions, for example, for forming a 600-V class GaN-SBD.

Initially, GaN substrate 41 of the n-type having a C-plane was prepared. GaN substrate 41 had a diameter of 4 inches (1 inch being equal to approximately 2.5 cm). GaN substrate 41 had resistivity of 8 (mΩ•cm) and a thickness of 500 μm.

N-type stop layer 42 and n-type drift layer 43 were formed on the C-plane of GaN substrate 41 with metal organic vapor phase epitaxy (MOVPE) through epitaxial growth. A concentration of a donor in stop layer 42 was $2 \times 10^{18}$ cm⁻³. A thickness of stop layer 42 was 0.5 μm. A concentration of a donor in drift layer 43 was $7 \times 10^{15}$ cm⁻³. A thickness of drift layer 43 was 5 μm. A growth temperature during epitaxial growth was set to 1050° C. As a source material for GaN, a gas of trimethyl gallium (TMG) and NH₃ was employed. SiH₄ (silane) was employed as an n-type dopant. A substrate constituted of GaN substrate 41, stop layer 42, and drift layer 43 is hereinafter also called a "GaN epitaxial substrate."

Surface protecting film 47 was formed on a surface 431 of drift layer 43. Surface protecting film 47 is an insulating film for a field plate (FP) as an edge-termination structure. Specifically, an SiNx film having a thickness of 0.5 μm was formed with plasma CVD, with the use of SiH₄ and NH₃ as source materials.

Thereafter, the GaN epitaxial substrate was subjected to heat treatment in an N₂ atmosphere with the use of a rapid thermal annealing (RTA) apparatus. Conditions for heat treatment were 600° C. and 3 minutes. Then, an opening was formed in a photoresist with photolithography. The SiNx film in the opening was removed with etching. An opening for the field plate was thus formed. In an etching step, the GaN epitaxial substrate was etched for 15 minutes with buffered hydrofluoric acid (50 weight % of HF and 40 weight % of NH₄F).

An area of the opening is equal to an area of the junction interface which is a region where Schottky electrode 45 and drift layer 43 are in direct contact with each other. As shown in Table 10, four types of samples different injunction interface area were prepared. The opening had a square shape, in order to prevent concentration of electric field at a corner portion, a corner portion of the opening was rounded (a radius of curvature being set to 20 μm).

TABLE 10

| | Sample 1 | Sample 2 | Sample 3 | Sample 4 |
|---|---|---|---|---|
| Junction Interface Area (mm²) | 0.89 | 1.8 | 0.54 | 0.18 |

After the photoresist was removed, a resist mask was formed with, photolithography. With EB evaporation, an Ni layer having a thickness of 50 nm and an Au layer having a thickness of 300 nm were formed. With lift-off in acetone, Schottky electrode 45 was formed. A length of a portion where Schottky electrode 45 and surface protecting film 47 (an SiN film) overlap with each other (an FP width) was set to 15 μm.

Thereafter, with photolithography and EB evaporation, a pad electrode was formed on Schottky electrode 45 with lift-off. The pad electrode is an electrode having a three-layered structure of a Ti film/a Pt film/an Au film, and the Ti film, the Pt film, and the Au film had thicknesses of 50 nm, 100 nm, and 3 μm, respectively. Thereafter, an electrode having a three-layered structure of an Al film/a Ti film/an Au film was formed as ohmic electrode 46 on the entire surface 411 (a back surface) of GaN substrate 41. The Al film, the Ti film, and the Au film, had thicknesses of 200 nm, 50 nm, and 500 nm, respectively. Furthermore, a backside pad electrode was formed on ohmic electrode 46. The backside pad electrode was an electrode having a three-layered structure of a Ti film/a Pt film/an Au film, and the Ti film, the Pt film, and the Au film, had thicknesses of 50 nm, 100 nm, and 1 μm, respectively.

The GaN epitaxial substrate above was diced into chips. The chip was mounted on a package through, die-bonding and wire-bonding. Die-bonding was carried out with the use of Sn—Ag solder at 230° C. Wire-bonding was carried out with the use of an Al wire.

Example 4-2

1200-V Class GaN-SBD

A 1200-V class GaN-SBD was fabricated with some conditions in the manufacturing process in Example 4-1 (the 600-V class GaN-SBD) being modified. Specifically, a concentration of a donor in stop layer 42 was set to $2 \times 10^{18}$ cm$^{-3}$ and a thickness of stop layer 42 was set to 1 μm. A concentration of a donor in drift layer 43 was set to $5 \times 10^{15}$ cm$^{-3}$ and a thickness of drift layer 43 was set to 10 μm. A thickness of surface protecting film 47 (the SiN film) was set to 1 μm. Furthermore, an FP width was set to 30 μm.

As shown in Table 11, four types of samples different injunction interface area were prepared by changing a size of Schottky electrode 45.

TABLE 11

| | Sample 1 | Sample 2 | Sample 3 | Sample 4 |
|---|---|---|---|---|
| Junction Interface Area (mm$^2$) | 1.1 | 2.3 | 0.68 | 0.23 |

Since other conditions are the same as the conditions in the manufacturing process in Example 4-1, subsequent description will not be repeated.

<Evaluation Method>

ON resistance R, a reverse blocking voltage, and response charges Q were measured with an evaluation method the same as the method according to the first embodiment. Therefore, details of the evaluation method will not be repeated.

<Results of Evaluation>

(1) R-Q Characteristics

Figure 19:
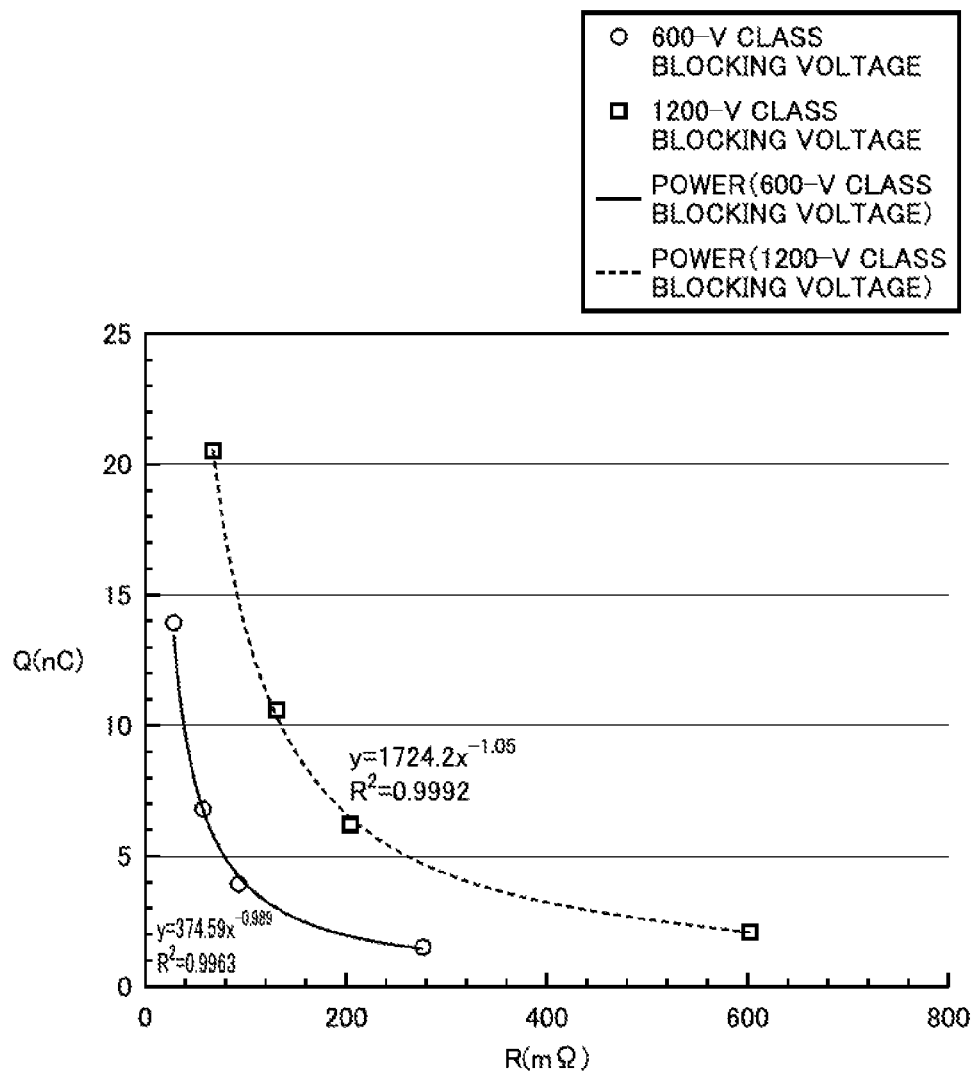
FIG. 19 is a diagram showing ON resistance R-response charge Q characteristics of samples according to Example 4-1 (a 600-V class blocking voltage device) and Example 4-2 (a 1200-V class blocking voltage device).

FIG. 19 is a diagram showing ON resistance R-response charge Q characteristics of samples according to Example 4-1 (the 600-V class blocking voltage device) and Example 4-2 (the 1200-V class blocking voltage device). Referring to FIG. 19, according to the sample in each Example, ON resistance R and response charges Q satisfy relation of substantially inverse proportion to each other. Such, relation can be understood from the Expression (6) and the Expression (6').

(2) RQ Product-$V_{blocking}$ Characteristics

Figure 20:
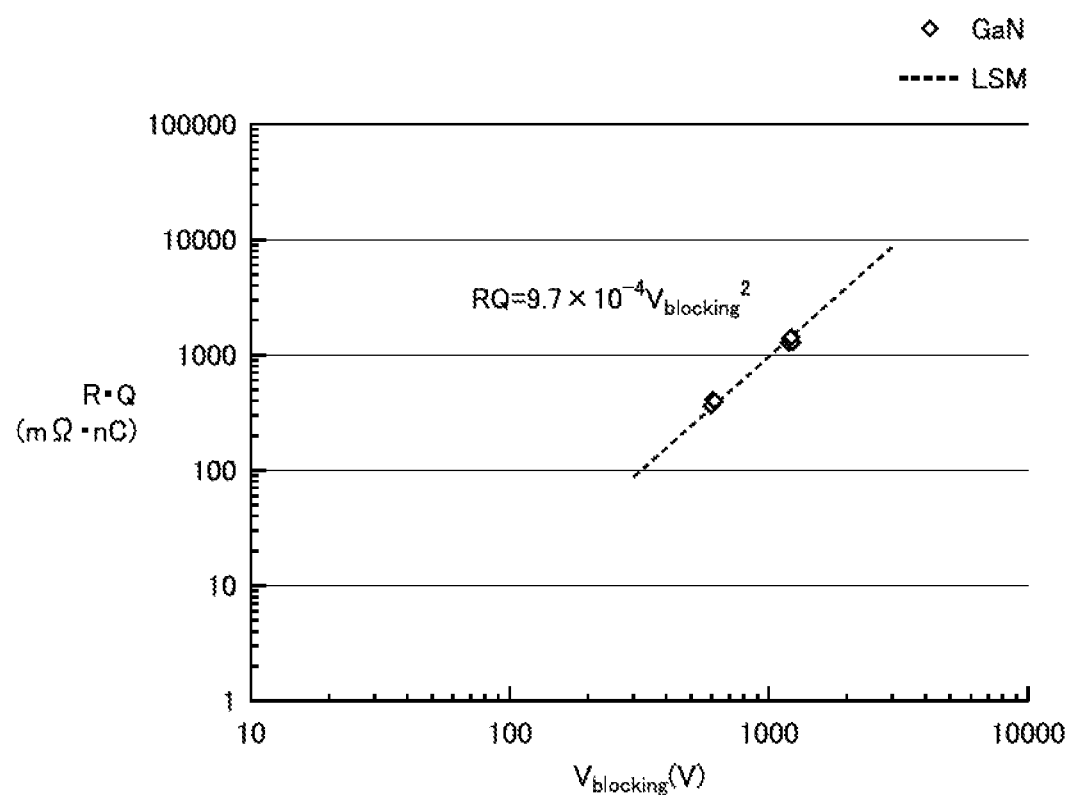
FIG. 20 is a diagram showing RQ product-$V_{blocking}$ characteristics of the samples according to Examples 4-1 and 4-2.

FIG. 20 is a diagram showing RQ product-$V_{blocking}$ characteristics of the samples according to Examples 4-1 and 4-2. Referring to FIG. 20, an RQ product is substantially determined by a value for reverse blocking voltage $V_{blocking}$. By subjecting a measurement value of an RQ product to least squares method fitting in accordance with the Expression (9), the following relational expression was obtained.

$$R \cdot Q = 9.7 \times 10^{-4} (m\Omega \cdot nC/V^2) \cdot V_{blocking}^2$$

A value for an RQ product in accordance with the expression above is a value obtained by optimizing a structure of the GaN epitaxial layer (drift layer 43 and stop layer 42) or an FP structure. Change in RQ product with these values will be explained with reference to a next embodiment.

Fifth Embodiment

Element Structure

A diode according to a fifth embodiment is a Schottky barrier diode composed of gallium nitride (GaN). Since a configuration of the diode according to the fifth embodiment is the same as the structure shown in FIG. 18, subsequent description will not be repeated. The diode according to the fifth embodiment is different from the diode according to the fourth embodiment in change in FP width.

Manufacturing Process

Example 5-1

600-V Class GaN-SBD

A sample according to Example 5-1 was fabricated with, a method the same as the method of fabricating the sample according to Example 4-1. A structure of the epitaxial layer was the same as the structure in Example 4-1. An area of the junction interface was set to be constant and an FP width was varied. Specifically, an area of the junction interface was set to 0.75 mm$^2$ which was the same as in Sample 3 according to Example 4-1. As shown in Table 12, samples of which FP widths were varied from 0 (without an FP structure) to 800 μm were prepared. A thickness of surface protecting film 47 (the SiN film) was set to 0.5 μm.

TABLE 12

| | Sample 1 | Sample 2 | Sample 3 | Sample 4 | Sample 5 | Sample 6 | Sample 7 | Sample 8 | Sample 9 |
|---|---|---|---|---|---|---|---|---|---|
| FP Width (μm) | 15 | 0 | 3 | 5 | 50 | 100 | 200 | 400 | 800 |

Example 5-2

1200-V Class GaN-SBD

A sample according to Example 5-2 was fabricated with a method the same as the method of fabricating the sample according to Example 4-2. A structure of the epitaxial layer was the same as the structure in Example 4-2. An area of the junction interface was set to be constant and an FP width was varied. Specifically, an area of the junction interface was set to 0.75 mm² which was the same as in Sample 3 according to Example 4-2. As shown in Table 13, samples of which FP widths were varied from 0 (without an FP structure) to 800 µm were prepared. A thickness of surface protecting film 47 (the SiN film) was set to 1 µm.

TABLE 13

|  | Sample 1 | Sample 2 | Sample 3 | Sample 4 | Sample 5 | Sample 6 | Sample 7 | Sample 8 | Sample 9 |
|---|---|---|---|---|---|---|---|---|---|
| FP Width (µm) | 30 | 0 | 3 | 5 | 50 | 100 | 200 | 400 | 800 |

<Evaluation Method>

ON resistance R, a reverse blocking voltage, and response charges Q were measured with an evaluation method the same as the method according to the first embodiment. Therefore, details of the evaluation method will not be repeated.

<Results of Evaluation>

Figure 21:
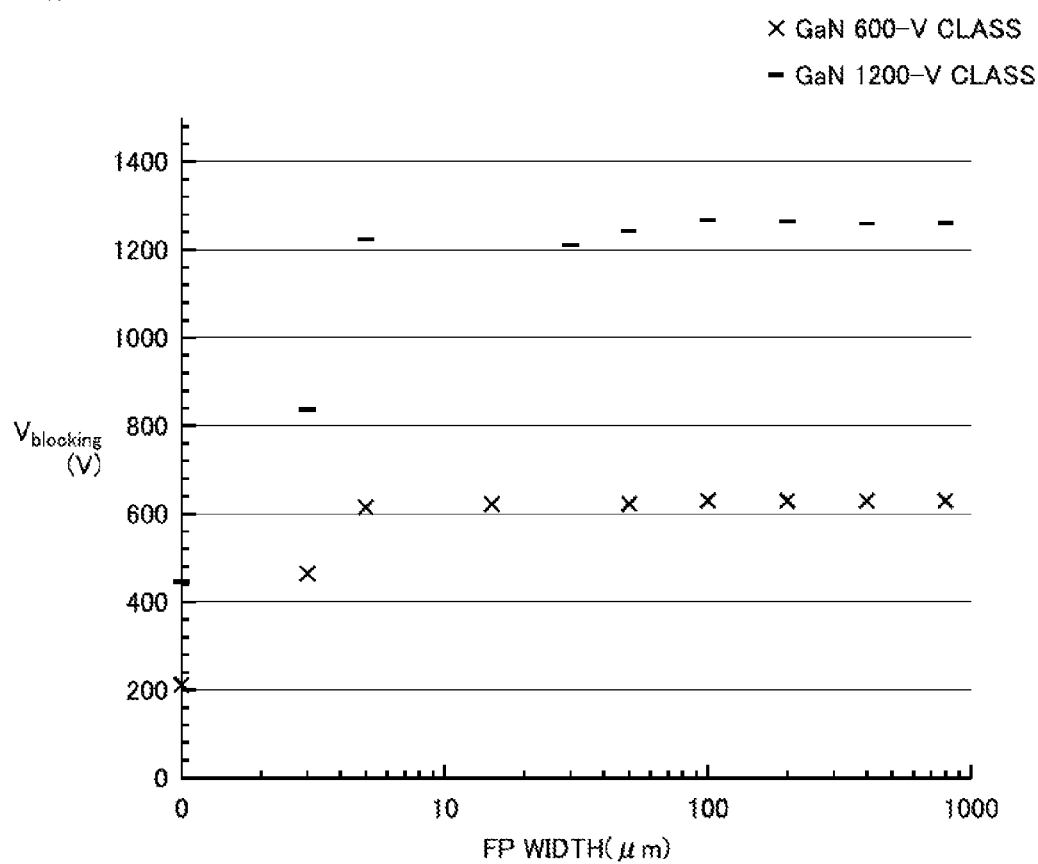
FIG. 21 is a diagram showing FP width-reverse blocking voltage characteristics of samples according to Examples 5-1 and 5-2.

FIG. 21 is a diagram showing FP width-reverse blocking voltage characteristics of samples according to Examples 5-1 and 5-2. Referring to FIG. 21, in a sample without an FP structure (having an FP width of 0) and a sample having an FP width of 3 µm, reverse blocking voltage $V_{blocking}$ lowered.

In Example 5-1, a sample having an FP width not smaller than 5 µm had reverse blocking voltage $V_{blocking}$ of approximately 600 V and achieved good results. Similarly in Example 5-2 as well, a sample having an FP width not smaller than 5 µm had reverse blocking voltage $V_{blocking}$ from approximately 1100 to approximately 1200 V and achieved good results.

It is considered that, when an FP width was not larger than 3 µm, a leakage current increased and reverse blocking voltage $V_{blocking}$ lowered because an effect to relax concentration of electric field by the FP structure weakened.

Furthermore, as shown in Table 14, in any of Examples 5-1 and 5-2, ON resistance R hardly changed depending on an FP width.

in the samples having an FP width from 0 to 50 µm, response charges Q are substantially constant. When an FP width was 100 µm, response charges Q slightly increased. A rate of increase in response charges Q was approximately 20%. When an FP width was not smaller than 100 µm, response charges Q significantly increased. It is considered that, when an FP width is great, charges originating from an FP region are unignorable as compared with charges originating from a Schottky electrode region, and hence total charges increase.

Figure 23:
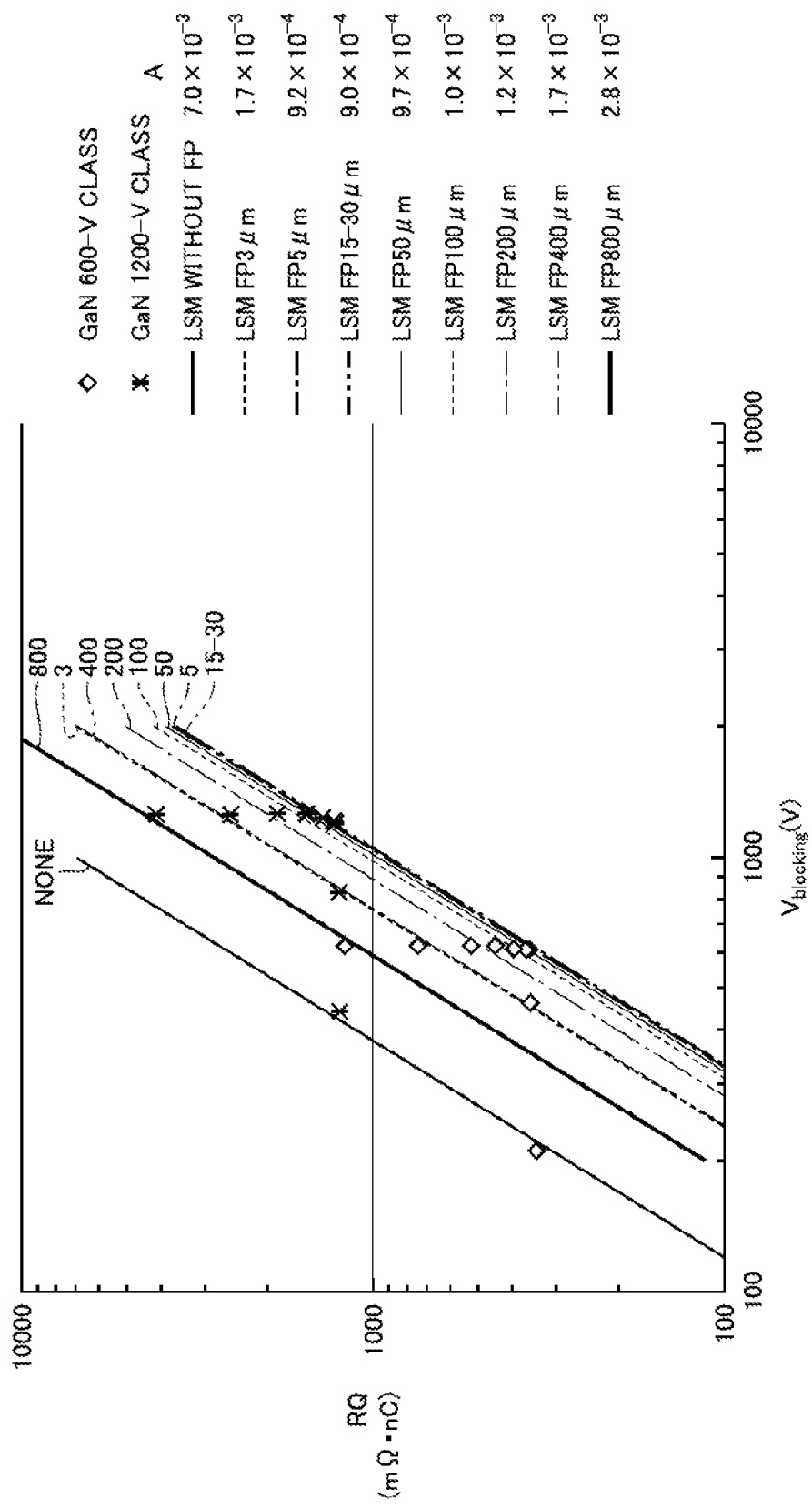
FIG. 23 is a diagram showing FP width dependency of RQ product-reverse blocking voltage $V_{blocking}$ characteristics.

FIG. 23 is a diagram showing FP width dependency of RQ product-reverse blocking voltage $V_{blocking}$ characteristics. In the relation shown in the Expression (9), an RQ product is in proportion to a square of reverse blocking voltage $V_{blocking}$. FIG. 24 is a diagram showing FP width dependency of factor of proportionality A shown in FIG. 23. Referring to FIG. 24, when an FP width was not larger than 3 µm, reverse blocking voltage $V_{blocking}$ lowered and A increased. In other words, the RQ product-reverse blocking voltage $V_{blocking}$ characteristics deteriorated. When an FP width was in a range from 5 to 200 µm, A attained to substantially a minimum value and it was substantially constant. When an FP width exceeds 200 µm, the RQ product started to increase and hence the RQ product-reverse blocking voltage $V_{blocking}$ characteristics deteriorated.

The sample according to Example 5-1 was employed as a sample having an FP width of 15 µm. The sample according to Example 5-2 was employed as a sample having an FP width of 30 µm. As above, in a range of an FP width from 15 to 30 µm, the RQ product attains to the minimum. Based on data of these two samples, values for factor A in a case that an FP width was set to 20 µm were plotted in FIG. 24.

From the Expression (13), total loss Lt in the diode is in proportion to a square root of an RQ product. When an FP width is not larger than 200 µm, increase in total loss Lt can be suppressed to 20% or lower. From the foregoing, an optimal range for an FP width is not smaller than 5 µm and not larger than 200 µm. An RQ product here can be expressed as in the Expression (18) below.

$$RQ \leq 1.2 \times 10^{-3} (\text{m}\Omega \cdot \text{nC/V}^2) \cdot V_{blocking}^2 \quad (18)$$

TABLE 14

|  | Sample 1 | Sample 2 | Sample 3 | Sample 4 | Sample 5 | Sample 6 | Sample 7 | Sample 8 | Sample 9 |
|---|---|---|---|---|---|---|---|---|---|
| Example 5-1 | | | | | | | | | |
| ON Resistance (mΩ) | 92 | 90 | 91 | 92 | 92 | 93 | 92 | 93 | 93 |
| Example 5-2 | | | | | | | | | |
| ON Resistance (mΩ) | 205 | 207 | 204 | 205 | 208 | 206 | 208 | 208 | 206 |

Figure 22:
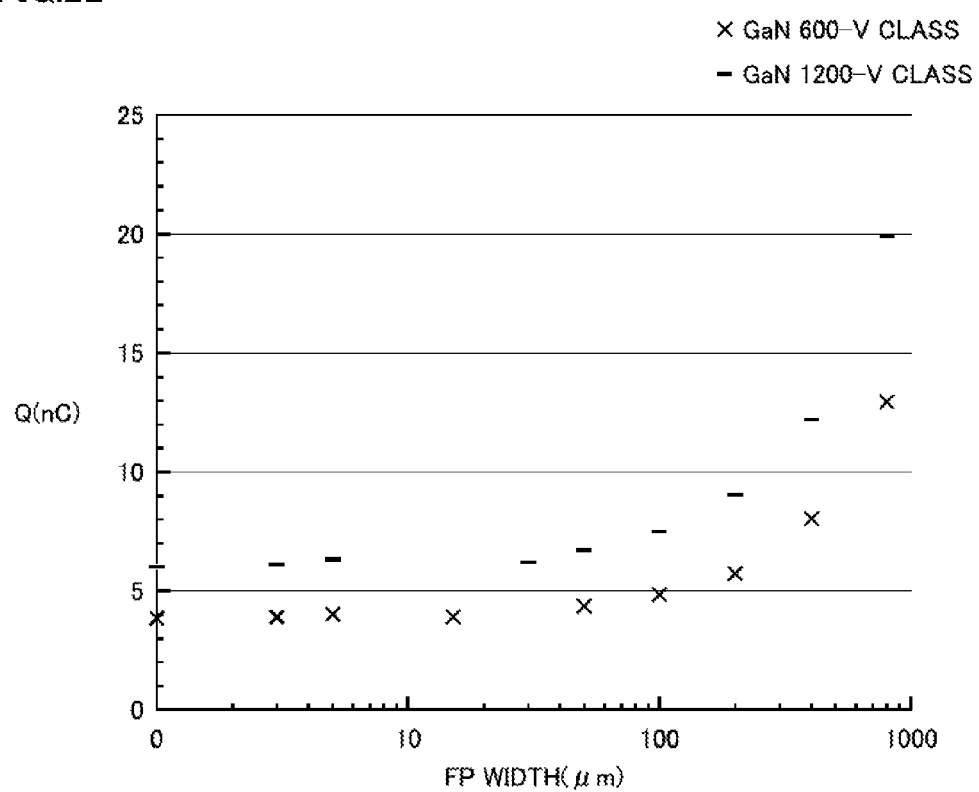
FIG. 22 is a diagram showing FP width-response charge Q characteristics of the samples according to Examples 5-1 and 5-2.

FIG. 22 is a diagram showing FP width-response charge Q characteristics of the samples according to Examples 5-1 and 5-2. Referring to FIG. 22, in both Examples 5-1 and 5-2, According to the fourth and fifth embodiments, a minimum RQ product can be obtained by employing GaN as a material for the diode and optimizing a structure of the epitaxial layer and a device structure. Therefore, according to the fifth embodiment, a diode having excellent switching characteristics can be provided as in the first to fourth, embodiments.

The discussion above is applicable also to an edge-termination, structure other than the field plate. An appropriate range of a length of such an edge-termination structure is again not smaller than 5 μm and not larger than 200 μm.

As set forth above, according to the fourth and fifth embodiments, by employing GaN for a material for the diode and optimizing a structure of the epitaxial layer and a device structure, a minimum RQ product can be obtained. Therefore, according to the fourth and fifth embodiments, a diode having excellent switching characteristics can be provided as in the first to third embodiments.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A diode, comprising:
an active layer; and
first and second electrodes for applying a forward voltage and a reverse voltage to said active layer,
change in voltage with respect to a current in forward current-voltage characteristics of said diode when said forward voltage is applied to said active layer through said first and second electrodes being defined as a forward ON resistance R (unit: mΩ),
said reverse voltage ⅔ times as high as said reverse voltage when breakdown of said diode is produced through said first and second electrodes being defined as a reverse blocking voltage $V_{blocking}$ (unit: V), and
charges obtained by integrating a reverse capacitance in a range of said reverse voltage from 0 to $V_{blocking}$ in accordance with reverse capacitance-voltage characteristics of said diode when said reverse voltage is applied to said diode through said first and second electrodes being defined as response charges Q (unit: nC) of said diode,
at a measurement temperature of 25° C., a product R•Q of said forward ON resistance R and said response charges Q satisfying relation of $R•Q \leq 0.24 \times V_{blocking}^2$.

2. The diode according to claim 1, wherein
said product R•Q satisfies relation of $R•Q \leq 0.1 \times V_{blocking}^2$.

3. The diode according to claim 2, wherein
a semiconductor material forming said diode is silicon.

4. The diode according to claim 1, wherein
said product R•Q satisfies relation of $R•Q \leq 4.7 \times 10^{-3} \times V_{blocking}^2$.

5. The diode according to claim 4, wherein
a semiconductor material forming said diode is silicon carbide.

6. The diode according to claim 1, wherein
said product R•Q satisfies relation of $R•Q \leq 1.2 \times 10^{-3} \times V_{blocking}^2$.

7. The diode according to claim 6, wherein
a semiconductor material forming said diode is gallium nitride.

8. The diode according to claim 4, wherein
said diode includes an edge-termination structure formed in said active layer, and said edge-termination structure has a width not smaller than 5 μm and not larger than 200 μm.

* * * * *